United States Patent
Lee et al.

(10) Patent No.: US 12,426,271 B2
(45) Date of Patent: Sep. 23, 2025

(54) SEMICONDUCTOR MEMORY DEVICE

(71) Applicant: SAMSUNG ELECTRONICS CO., LTD., Suwon-si (KR)

(72) Inventors: Kyunghwan Lee, Seoul (KR); Yongseok Kim, Suwon-si (KR); Hyuncheol Kim, Seoul (KR); Jongman Park, Hwaseong-si (KR); Dongsoo Woo, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 784 days.

(21) Appl. No.: 17/590,087

(22) Filed: Feb. 1, 2022

(65) Prior Publication Data
US 2023/0024307 A1    Jan. 26, 2023

(30) Foreign Application Priority Data
Jul. 21, 2021 (KR) .................. 10-2021-0096001

(51) Int. Cl.
*H10B 12/00* (2023.01)
*H10B 53/30* (2023.01)

(52) U.S. Cl.
CPC .................... *H10B 53/30* (2023.02)

(58) Field of Classification Search
CPC ...... H10B 53/30; H10B 12/036; H10B 12/05; H10B 53/20; H10B 12/00; H10B 12/01; H10B 53/10; H10D 1/682; H10D 1/716
See application file for complete search history.

(56) References Cited

U.S. PATENT DOCUMENTS

| | | | |
|---|---|---|---|
| 6,635,498 B2 | 10/2003 | Summerfelt et al. | |
| 6,807,082 B2 | 10/2004 | Aoki et al. | |
| 9,754,946 B1 | 9/2017 | Yang et al. | |
| 10,153,018 B2 * | 12/2018 | Derner | H10B 53/00 |
| 10,403,631 B1 | 9/2019 | Lu et al. | |
| 10,600,468 B2 | 3/2020 | Pan et al. | |
| 10,607,994 B2 | 3/2020 | Derner et al. | |
| 10,847,516 B2 | 11/2020 | Mathew et al. | |
| 10,971,204 B2 | 4/2021 | Jiang et al. | |
| 2008/0283816 A1 | 11/2008 | Takaishi | |
| 2015/0035065 A1 | 2/2015 | Park et al. | |
| 2015/0318285 A1 | 11/2015 | Zhang | |
| 2020/0235110 A1 | 7/2020 | Morris et al. | |
| 2020/0357454 A1 | 11/2020 | Derner et al. | |
| 2020/0381290 A1 | 12/2020 | Ramaswamy | |

(Continued)

FOREIGN PATENT DOCUMENTS

| | | |
|---|---|---|
| CN | 110827880 B | 10/2020 |
| KR | 10-2004-0059486 A | 7/2004 |
| TW | I636524 B | 9/2018 |

OTHER PUBLICATIONS

Office Action dated May 1, 2023, issued by Taiwan Patent Office in Taiwan Patent Application No. 111119230.

(Continued)

*Primary Examiner* — David Vu
(74) *Attorney, Agent, or Firm* — Sughrue Mion, PLLC

(57) ABSTRACT

A semiconductor memory device is provided. The semiconductor memory device includes a substrate; a transistor disposed above the substrate, the transistor having a channel region defining an inner space; and a capacitor passing through the transistor in a vertical direction in the inner space.

20 Claims, 48 Drawing Sheets

(56) References Cited

U.S. PATENT DOCUMENTS

2021/0012824 A1    1/2021   Mutch et al.
2021/0111179 A1    4/2021   Shivaraman et al.

OTHER PUBLICATIONS

Communication issued on Jul. 14, 2025 by the Korean Intellectual Property Office in Korean Patent Application No. 10-2021-0096001.

* cited by examiner

SEMICONDUCTOR MEMORY DEVICE

CROSS-REFERENCE TO RELATED APPLICATION

This application is based on and claims priority under 35 U.S.C. § 119 to Korean Patent Application No. 10-2021-0096001, filed on Jul. 21, 2021, in the Korean Intellectual Property Office, the disclosure of which is incorporated by reference herein in its entirety.

BACKGROUND

The inventive concept relates to a semiconductor memory device, and more particularly, to a semiconductor memory device including a memory cell including a transistor and a capacitor.

Due to the development of electronics technology, the downscaling of semiconductor memory devices has rapidly progressed. Thus, there is a need to develop a technique of integrating a relatively large number of memory cells in the same area by reducing the size of a memory cell including a transistor and a capacitor. However, existing techniques are limited when it comes down to reducing an area occupied by each of the transistor and the capacitor included in the memory cell.

SUMMARY

The inventive concept provides a semiconductor memory device having a structure capable of reducing the size of a memory cell including a transistor and a capacitor while maintaining reliability and ensuring capacitance required for a memory cell.

According to an embodiment, there is provided a semiconductor memory device including: a substrate; a transistor disposed above the substrate, the transistor having a channel region defining an inner space; and a capacitor passing through the transistor in a vertical direction in the inner space.

According to an embodiment, there is provided a semiconductor memory device including: a first transistor on a substrate, the first transistor including a first channel region at a first vertical level above the substrate and a first gate facing the first channel region; a second transistor at a second vertical level above the substrate, the second transistor including a second channel region defining an inner space and a second gate at a third vertical level, wherein the second vertical level is different from the first vertical level, and the third vertical level is different from the first vertical level and the second vertical level; and a capacitor passing through the second transistor in a vertical direction in the inner space, wherein the capacitor includes a first electrode configured to be connected to the first transistor, a second electrode configured to be connected to the second transistor, and a dielectric film between the first electrode and the second electrode.

According to an embodiment, there is provided a semiconductor memory device including: a plurality of first transistors repeatedly arranged in a first lateral direction and a second lateral direction at a first vertical level above a substrate, the plurality of first transistors including a plurality of first channel regions, each of the plurality of first channel regions providing a channel in a vertical direction, wherein the first lateral direction intersects with the second lateral direction; a plurality of second transistors repeatedly arranged in the first lateral direction and the second lateral direction at a second vertical level above the substrate, the plurality of second transistors including a plurality of second channel regions, each of the plurality of second channel regions defining inner spaces, wherein the second vertical level is higher than the first vertical level; a plurality of capacitors passing through the plurality of second transistors in the vertical direction in the inner spaces respectively defined by the plurality of second channel regions, respectively; and an upper conductive line connected to a first group of capacitors arranged in a line extending in the first lateral direction, from among the plurality of capacitors, the upper conductive line extending in the first lateral direction over the first group of capacitors to overlap the first group of capacitors in the vertical direction, wherein the upper conductive line is configured to operate as a first common gate for a first group of second transistors in the second vertical level arranged in the line extending in the first lateral direction, from among the plurality of second transistors.

BRIEF DESCRIPTION OF THE DRAWINGS

Embodiments of the inventive concept will be more clearly understood from the following detailed description taken in conjunction with the accompanying drawings in which:

FIGS. 11A to 27 are diagrams illustrating a method of manufacturing a semiconductor memory device, according to example embodiments, wherein FIGS. 11A, 12A, 13A, 14A, 21A, 23A, 24A, and 25A are plan views of processes of manufacturing the semiconductor memory device, FIGS. 11B, 12B, 13B, 14B, 15 to 20, 21B, 22, 23B, 24B, 25B, 26, and 27 are cross-sectional views of a process sequence of manufacturing the semiconductor memory device, according to an example embodiment, and FIGS. 11B, 12B, 13B, 14B, 21B, 23B, 24B, and 25B are cross-sectional views taken along lines X1-X1' of FIGS. 11A, 12A, 13A, 14A, 21A, 23A, 24A, and 25A, respectively.

DETAILED DESCRIPTION

Figure 1A:
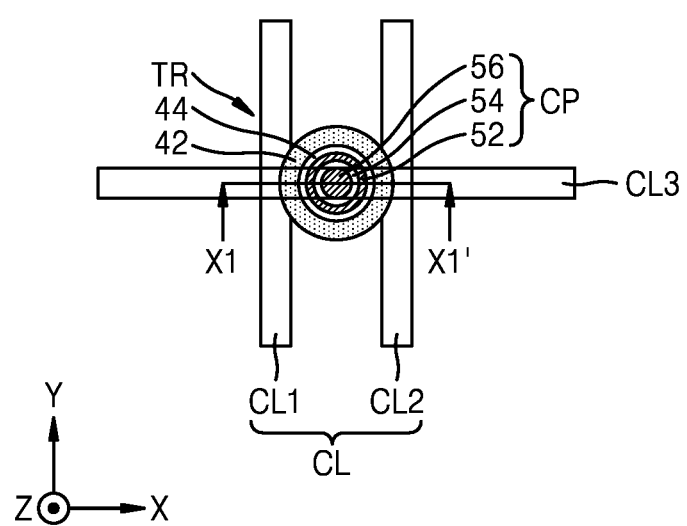
FIG. 1A is a plan view diagram of a semiconductor memory device according to an embodiment.

All of the embodiments described herein are example embodiments, and thus, the inventive concept is not limited thereto and may be realized in various other forms.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Hereinafter, embodiments will be described in detail with reference to the accompanying drawings. The same reference numerals are used to denote the same elements in the drawings, and repeated descriptions thereof are omitted.

Figure 1B:
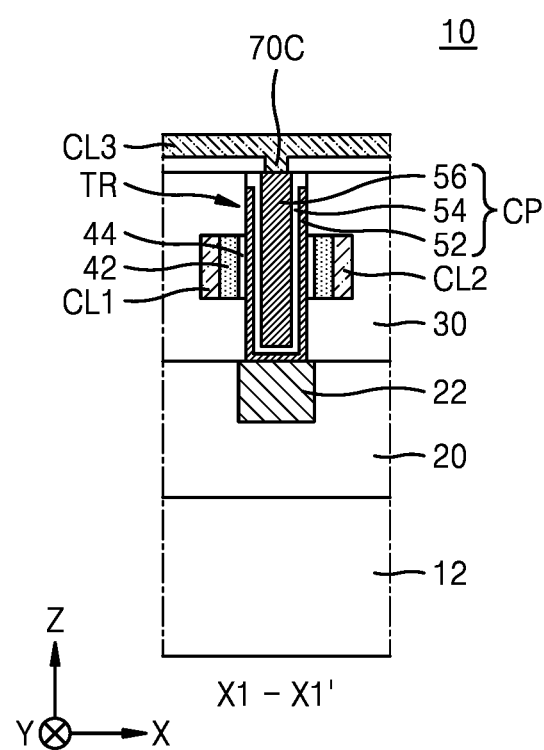
FIG. 1B is a cross-sectional view taken along a line X1-X1' of FIG. 1A.

FIG. 1A is a plan view diagram of a semiconductor memory device 10 according to an embodiment. FIG. 1B is a cross-sectional view taken along a line X1-X1' of FIG. 1A.

Referring to FIGS. 1A and 1B, the semiconductor memory device 10 may include a transistor TR on a substrate 12 and a capacitor CP passing through the transistor TR in a vertical direction (Z direction).

The transistor TR may include a channel region 42 having a cylindrical shape to define an inner space and a gate dielectric film 44 disposed on an inner surface of the channel region 42. The capacitor CP may pass through the transistor TR in the vertical direction (Z direction) in the inner space defined by the channel region 42 of the transistor TR.

The capacitor CP may include a first electrode 52, a dielectric film 54, and a second electrode 56, which are sequentially arranged from the channel region 42 toward the center of the inner space defined by the channel region 42. The first electrode 52 may extend in the vertical direction (Z direction) in the inner space of the transistor TR and have a cylindrical shape of which a bottom surface of the first electrode 52 is connected to a conductive region 22 on the substrate 12.

The substrate 12 may include a semiconductor material (e.g., silicon (Si) or germanium (Ge)) or a compound semiconductor (e.g., silicon germanium (SiGe), silicon carbide (SiC), gallium arsenide (GaAs), indium arsenide (InAs), indium gallium arsenide (InGaAs), or indium phosphide (InP)). A lower structure 20 may be on the substrate 12, and the lower structure 20 may include the conductive region 22. The conductive region 22 may include a doped well, a doped structure, or a conductive layer. In example embodiments, the conductive region 22 may include a source/drain region of a transistor or a contact plug connected to the source/drain region.

The first electrode 52 of the capacitor CP may have an outer surface facing the channel region 42 of the transistor TR and an inner surface in contact with the dielectric film 54. The dielectric film 54 of the capacitor CP may have a cylindrical shape of which a bottom surface of the dielectric film 54 is disposed on a bottom inner surface of the first electrode 52. The dielectric film 54 may have an outer surface in contact with the first electrode 52 and an inner surface in contact with the second electrode 56. The second electrode 56 of the capacitor CP may be on the dielectric film 54 in the inner space defined by the channel region 42.

The second electrode 56 of the capacitor CP may be spaced apart from the first electrode 52 with the dielectric film 54 therebetween. A sidewall and a bottom surface of the second electrode 56 may be surrounded by the first electrode 52. An uppermost surface of the second electrode 56 may be farther from the substrate 12 than an uppermost surface of the first electrode 52, and the uppermost surface of the first electrode 52 may be covered by the dielectric film 54.

The gate dielectric film 44 of the transistor TR may be disposed between the inner surface of the channel region 42 and the outer surface of the first electrode 52 of the capacitor CP. The dielectric film 44 may have a ring shape in a view from the Z direction (e.g., an X-Y plane). The capacitor CP may pass through the inner space of the dielectric film 44 in the vertical direction (Z direction). The outer surface of the dielectric film 44 may be in contact with the inner surface of the channel region 42, and the inner surface of the dielectric film 44 may be in contact with the first electrode of the capacitor CP.

The semiconductor memory device 10 may include a first conductive line CL1 and a second conductive line CL2, each of which is configured to be connected to the channel region 42 of the transistor TR. Each of the first conductive line CL1 and the second conductive line CL2 may extend in a second lateral direction (Y direction), which intersects with a first lateral direction (X direction).

The first conductive line CL1 and the second conductive line CL2 may be connected to portions of the channel region 42 and set apart from each other. The first conductive line CL1 and the second conductive line CL2 may be apart from each other with the channel region 42, the gate dielectric film 44, and the capacitor CP therebetween in a lateral direction (e.g., X direction) and be parallel to each other. One of the first conductive line CL1 and the second conductive line CL2 may function as a bit line connected to the transistor TR, and the other of the first conductive line CL1 and the second conductive line CL2 may function as a source line connected to the transistor TR.

The transistor TR and the capacitor CP may be covered by an insulating structure 30 arranged in the vicinities thereof. The insulating structure 30 may include an oxide film. The third conductive line CL3 may extend long in the first lateral direction (X direction) on the insulating structure 30. The third conductive line CL3 may be at a higher level than the capacitor CP. The third conductive line CL3 may be connected to the second electrode 56 of the capacitor CP through a contact portion 70C. The third conductive line CL3 may be connected to the gate dielectric film 44 of the transistor TR through the capacitor CP. The third conductive line CL3 may be used as a plate electrode in the capacitor CP and used as a gate electrode in the transistor TR.

In example embodiments, each of the first conductive line CL1, the second conductive line CL2, and the third conductive line CL3 may include a metal, a conductive metal nitride, a conductive semiconductor material, or a combination thereof. For example, each of the first conductive line CL1, the second conductive line CL2, and the third conductive line CL3 may include tungsten (W), aluminum (Al), copper (Cu), cobalt (Co), molybdenum (Mo), titanium (Ti), tantalum (Ta), titanium nitride (TiN), tantalum nitride (TaN), tungsten nitride (WN), tungsten carbonitride (WCN), titanium silicon nitride (TiSiN), tantalum silicon nitride (TaSiN), tungsten silicon nitride (WSiN), or a combination thereof, without being limited thereto.

In example embodiments, the channel region 42 may include undoped polysilicon, doped polysilicon, a compound semiconductor material, an oxide semiconductor material, a two-dimensional (2D) semiconductor material, or a combination thereof.

The compound semiconductor material may be selected from a Group IV-IV compound semiconductor, a Group III-V compound semiconductor, a Group II-VI compound semiconductor, and a Group IV-VI compound semiconductor. The Group IV-IV compound semiconductor may be selected from among silicon germanium (SiGe), silicon carbide (SiC), silicon germanium carbide (SiGeC), germanium tin (GeSn), silicon tin (SiSn), and silicon germanium tin (SiGeSn). The Group III-V compound semiconductor may include a compound semiconductor including at least one of indium (In), gallium (Ga), or aluminum (Al) as a Group III element and at least one element of arsenide (As), phosphorus (P), or antimony (Sb) as a Group V element. The Group III-V compound semiconductor may include a binary, ternary, or quaternary compound including two, three, or four elements selected from Group III and V elements. The binary compound may be selected from among indium phosphide (InP), gallium arsenide (GaAs), gallium phosphide (GaP), indium arsenide (InAs), indium antimonide (InSb), and gallium antimonide (GaSb), and the ternary compound may be selected from among indium gallium phosphide (InGaP), indium gallium arsenide (InGaAs), aluminum indium arsenide (AlInAs), indium gallium antimonide (InGaSb), gallium arsenide antimonide (GaAsSb), and gallium arsenide phosphide (GaAsP), without being limited thereto. The Group II-VI compound semiconductor may include a binary, ternary, or quaternary compound including two, three, or four elements selected from Group II and VI elements. The Group II-VI compound semiconductor may be selected from among cadmium selenide (CdSe), zinc telluride (ZnTe), cadmium sulfide (CdS), zinc sulfide (ZnS), zinc selenide (ZnSe), and mercury cadmium telluride (HgCdTe), without being limited thereto. The Group IV-VI compound semiconductor may include lead sulfide (PbS), without being limited thereto.

The oxide semiconductor material may be selected from among indium gallium zinc oxide (InGaZnO) (also referred to as "IGZO"), tin indium gallium zinc oxide (Sn-IGZO), indium tungsten oxide (InWO) (also referred to as "IWO"), indium zinc oxide (InZnO) (also referred to as "IZO"), zinc tin oxide (ZnSnO) (also referred to as "ZTO"), zinc oxide (ZnO), yttrium-doped zinc oxide (YZO), indium gallium silicon oxide (InGaSiO) (also referred to as "IGZO"), indium oxide (InO), tin oxide (SnO), titanium oxide (TiO), zinc oxynitride (ZnON), magnesium zinc oxide (MgZnO), zirconium indium zinc oxide (ZrInZnO), hafnium indium zinc oxide (HfInZnO) (also referred to as "HIZO"), tin indium zinc oxide (SnInZnO), aluminum tin indium zinc oxide (AlSnInZnO), silicon indium zinc oxide (SiInZnO), aluminum zinc tin oxide (AlZnSnO), gallium zinc tin oxide (GaZnSnO), and zirconium zinc tin oxide (ZrZnSnO), without being limited thereto.

In example embodiments, the 2D semiconductor material may include a transition metal dichalcogenide or a bipolar semiconductor material using both electrons and holes as driving charges. For example, the 2D semiconductor material may be selected from among molybdenum disulfide ($MoS_2$), molybdenum diselenide ($MoSe_2$), tungsten disulfide ($WS_2$), niobium disulfide ($NbS_2$), tantalum disulfide ($TaS_2$), zirconium disulfide ($ZrS_2$), hafnium disulfide ($HfS_2$), technetium disulfide ($TcS_2$), rhenium disulfide ($ReS_2$), copper disulfide ($CuS_2$), gallium disulfide ($GaS_2$), indium disulfide ($InS_2$), tin disulfide ($SnS_2$), germanium disulfide ($GeS_2$), lead disulfide ($PbS_2$), molybdenum disulfide ($MoSe_2$), tungsten disulfide ($WSe_2$), niobium disulfide ($NbSe_2$), tantalum disulfide ($TaSe_2$), zirconium disulfide ($ZrSe_2$), hafnium diselenide ($HfSe_2$), technetium diselenide ($TcSe_2$), rhenium diselenide ($ReSe_2$), copper diselenide ($CuSe_2$), gallium diselenide ($GaSe_2$), indium diselenide ($InSe_2$), tin diselenide ($SnSe_2$), germanium diselenide ($GeSe_2$), lead diselenide ($PbSe_2$), molybdenum ditelluride ($MoTe_2$), tungsten ditelluride ($WTe_2$), niobium ditelluride ($NbTe_2$), tantalum ditelluride ($TaTe_2$), zirconium ditelluride ($ZrTe_2$), hafnium ditelluride ($HTe_2$), technetium ditelluride ($TcTe_2$), rhenium ditelluride ($ReTe_2$), copper ditelluride ($CuTe_2$), gallium ditelluride ($GaTe_2$), indium ditelluride ($InTe_2$), tin ditelluride ($SnTe_2$), germanium ditelluride ($GeTe_2$), and lead ditelluride ($PbTe_2$), without being limited thereto.

For example, the channel region 42 of the transistor TR may include doped polysilicon. In this case, the channel region 42 may include a pair of ohmic contact portions, which are in contact with the first conductive line CL1 and the second conductive line CL2 and have a higher dopant concentration than the other portion of the channel region 42.

In example embodiments, the gate dielectric film 44 may include a silicon oxide film, a high-k dielectric film, or a combination thereof. The high-k dielectric film may include a material having a higher dielectric constant than a silicon oxide film. The high-k dielectric film may include a metal oxide or a metal oxynitride. For example, the gate dielectric film 44 may include a silicon oxide film, a hafnium oxide film, or a combination thereof, without being limited thereto.

Each of the first electrode 52 and the second electrode 56 of the capacitor CP may include a metal film, a conductive metal oxide film, a conductive metal nitride film, a conductive metal oxynitride film, or a combination thereof. In example embodiments, each of the first electrode 52 and the second electrode 56 may include titanium (Ti), Ti oxide, Ti nitride, Ti oxynitride, niobium (Nb), Nb oxide, Nb nitride, Nb oxynitride, cobalt (Co), Co oxide, Co nitride, Co oxynitride, tin (Sn), Sn oxide, Sn nitride, Sn oxynitride, or a combination thereof. For example, each of the first electrode 52 and the second electrode 56 may include tin nitride (TiN), niobium nitride (NbN), cobalt nitride (CoN), tin oxide ($SnO_2$), tantalum nitride (TaN), titanium aluminum nitride (TiAlN), tantalum aluminum nitride (TaAlN), vanadium (V), VN, molybdenum (Mo), molybdenum nitride (MoN), tungsten (W), tungsten nitride (WN), ruthenium (Ru), ruthenium oxide ($RuO_2$), strontium ruthenate ($SrRuO_3$), iridium (Ir), iridium oxide ($IrO_2$), platinum (Pt), platinum oxide (PtO), barium strontium ruthenate (($Ba,Sr)RuO_3$) (also referred to as "BSRO"), calcium ruthenate ($CaRuO_3$) (also referred to as "CRO"), lanthanum strontium ruthenate ((La, Sr)$CoO_3$) (also referred to as "LSCO"), or a combination thereof. However, a constituent material of each of the first electrode 52 and the second electrode 56 is not limited to the examples described above.

The dielectric film 54 of the capacitor CP may include a high-k dielectric film having a higher dielectric constant than a silicon oxide film. In example embodiments, the dielectric film 54 may include a metal oxide including at least one metal selected from hafnium (Hf), zirconium (Zr), aluminum (Al), niobium (Nb), cerium (Ce), lanthanum (La), tantalum (Ta), and titanium (Ti). In example embodiments, the dielectric film 54 may have a single structure including one high-k dielectric film. In other example embodiments, the dielectric film 54 may have a multilayered structure including a plurality of high-k dielectric films. The high-k dielectric film may include hafnium oxide ($HfD_2$), zirconium oxide ($ZrO_2$), aluminum oxide ($Al_2O_3$), lanthanum oxide ($La_2O_3$), tantalum oxide ($Ta_2O_3$), niobium pentoxide ($Nb_2O_5$), cerium oxide ($CeO_2$), titanium oxide ($TiO_2$), germanium oxide ($GeO_2$), or a combination thereof, without being limited thereto.

The semiconductor memory device 10 described with reference to FIGS. 1A and 1B may include the transistor TR and the capacitor CP passing through the transistor TR in the vertical direction (Z direction). Accordingly, even when the semiconductor memory device 10 has a reduced area with the downscaling trend, the capacitance of the capacitor CP may be ensured, and the reliability of the transistor TR may be maintained. In addition, a memory cell including the transistor TR and the capacitor CP may be miniaturized. Accordingly, the integration density of the semiconductor memory device 10 may be improved.

Figure 2A:
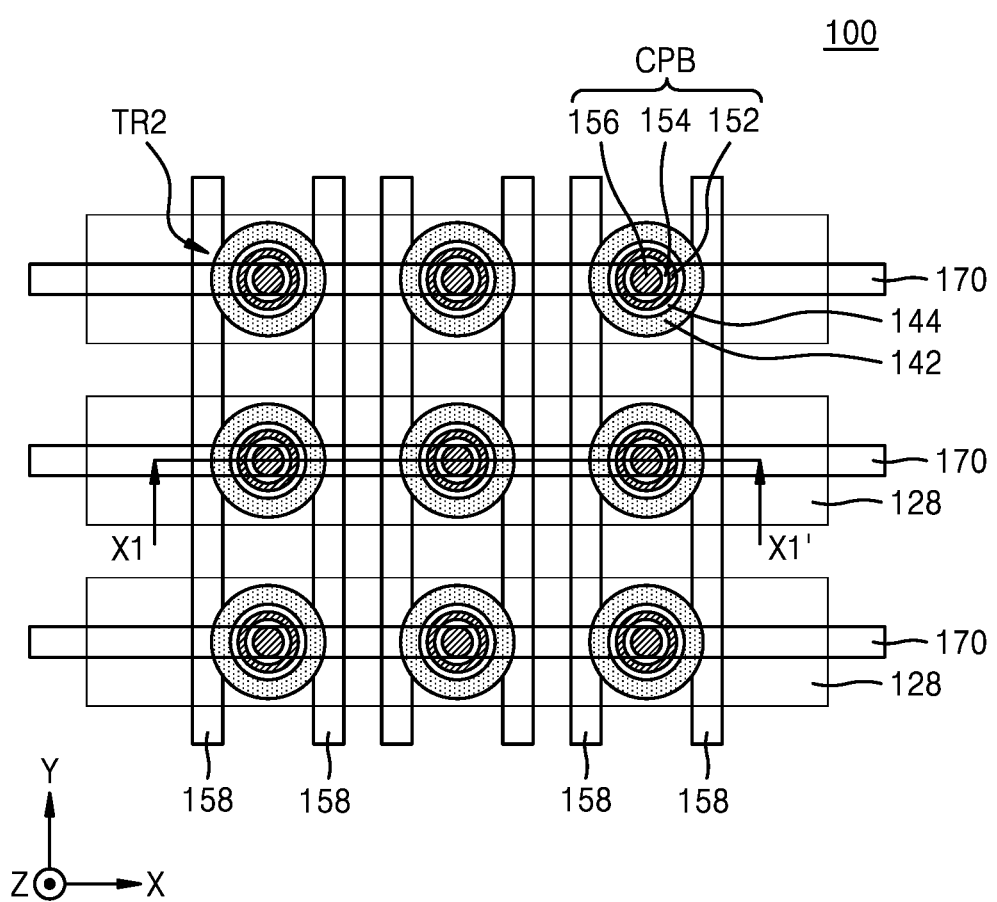
FIG. 2A is a plan view diagram of a semiconductor memory device according to an embodiment.
Figure 2B:
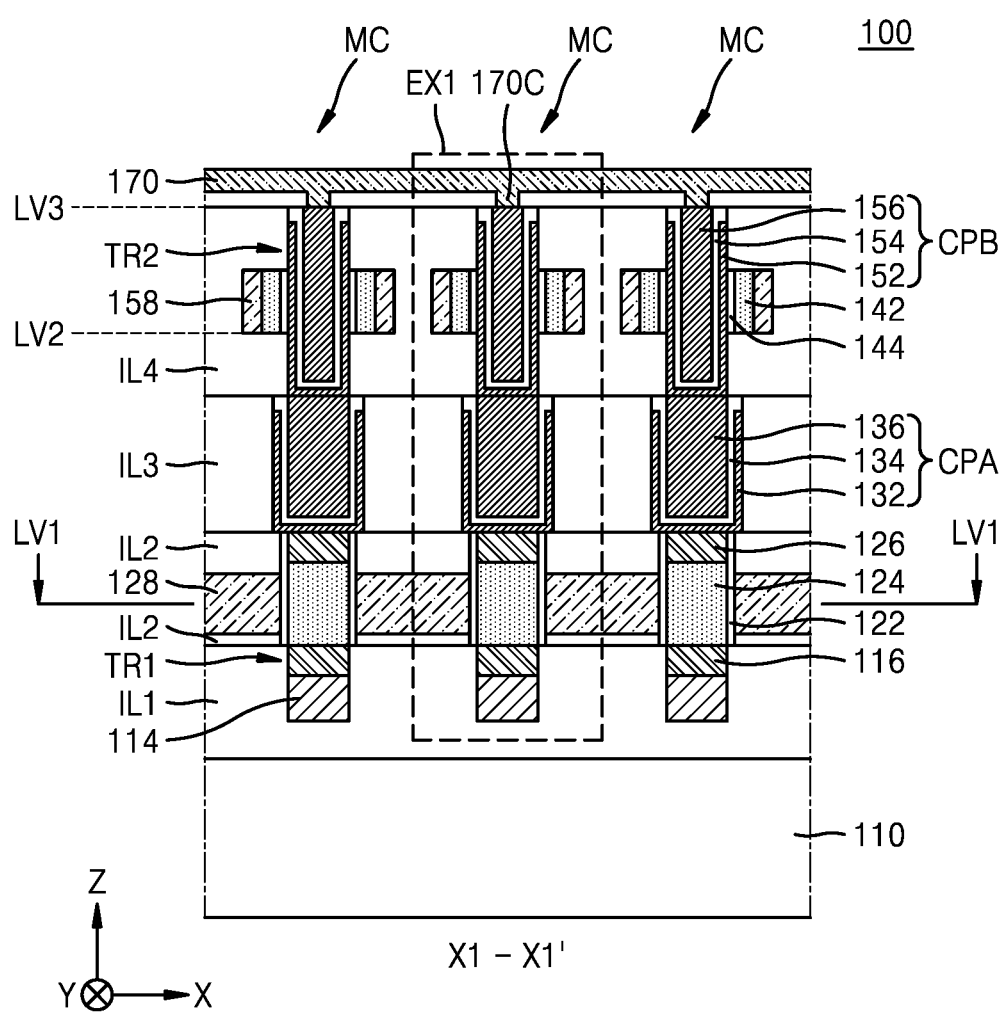
FIG. 2B is a cross-sectional view taken along a line X1-X1' of FIG. 2A.
Figure 2C:
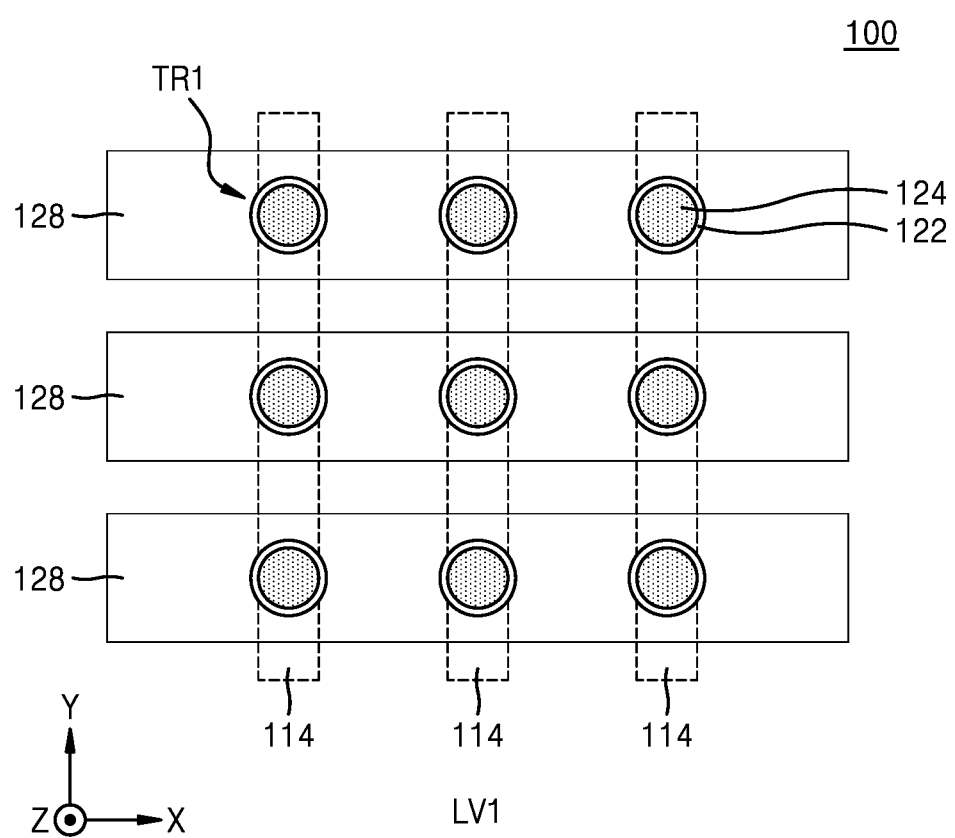
FIG. 2C is a plan view diagram of a plane taken along a first vertical level of FIG. 2B.
Figure 2D:
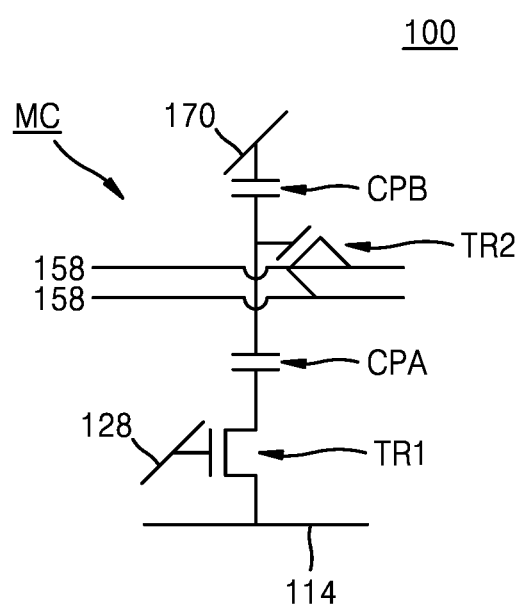
FIG. 2D is a circuit diagram of a memory cell shown in FIG. 2B.

FIGS. 2A to 2D are diagrams of a semiconductor memory device 100 according to embodiments. More specifically, FIG. 2A is a plan view diagram of the semiconductor memory device 100. FIG. 2B is a cross-sectional view taken along a line X1-X1' of FIG. 2A. FIG. 2C is a plan view diagram of a plane taken along a first vertical level LV1 of FIG. 2B. FIG. 2D is a circuit diagram of a memory cell MC corresponding to a dashed region EX1 of FIG. 2B.

Referring to FIGS. 2A to 2D, the semiconductor memory device 100 may include a plurality of memory cells MC on a substrate 110. On the substrate 110, a plurality of first transistors TR1, a plurality of second transistors TR2, a plurality of lower capacitors CPA, and a plurality of upper capacitors CPB, which are included in the plurality of memory cells MC, may be repeatedly arranged in a matrix form in a first lateral direction (X direction) and a second lateral direction (Y direction).

Each of the plurality of memory cells MC may include a two transistors and two capacitors (2T-2C) memory cell, that is, one first transistor TR1, one second transistor TR2, one lower capacitor CPA, and one upper capacitor CPB. As used herein, each of the plurality of first transistors TR1 may be referred to as a "lower transistor," each of the plurality of upper capacitors CPB may be referred to as a "first capacitor" or a "capacitor," and each of the plurality of lower capacitors CPA may be referred to as a "second capacitor" or a "ferroelectric capacitor."

Each of the plurality of first transistors TR1 may include a first channel region 124 and a conductive line 128, which are at the first vertical level LV1 between the substrate 110 and the plurality of lower capacitors CPA. The substrate 110 may be substantially the same as those of the substrate 12 described with reference to FIGS. 1A and 1B. The conductive line 128 may have a surface facing the first channel region 124. As shown in FIG. 2C, the conductive line 128 may provide a gate-all-around (GAA) structure surrounding the first channel region 124 viewed from a Z direction. The conductive line 128 may operate as a common gate or a common word line of the plurality of first transistors TR1, which are arranged in a line in the first lateral direction (X direction). Planar positions of a plurality of conductive lines 114 are illustrated with dashed lines in FIG. 2C for brevity.

As shown in FIG. 2B, each of the plurality of first transistors TR1 may include a lower impurity region 116 and an upper impurity region 126, which are respectively connected to a lower end portion and an upper end portion of the first channel region 124. The first channel region 124 may provide a channel in a vertical direction (Z direction) between the lower impurity region 116 and the upper impurity region 126.

A constituent material of the first channel region 124 may be substantially the same as that of the channel region 42 described with reference to FIGS. 1A and 1B. For example, the first channel region 124 may include undoped polysilicon or doped polysilicon, and each of the lower impurity region 116 and the upper impurity region 126 may include doped polysilicon. A dopant concentration of the lower impurity region 116 and the upper impurity region 126 may be higher than a dopant concentration of the first channel region 124.

As shown in FIG. 2B, the first transistor TR1 may include a first gate dielectric film 122 between the first channel region 124 and the conductive line 128. The first gate dielectric film 122 may have a cylindrical shape surrounding an outer sidewall of the first channel region 124. The first gate dielectric film 122 may have an inner surface in contact with the first channel region 124 and an outer surface in contact with the conductive line 128. Constituent materials of the first gate dielectric film 122 and the conductive line 128 may be substantially the same as those of the third conductive line CL3 and the gate dielectric film 44, which have been described with reference to FIGS. 1A and 1B. The first transistor TR1 may be covered by an insulating structure IL2. The insulating structure IL2 may include an oxide film.

As shown in FIG. 2B, the plurality of conductive lines 114 may be between the substrate 110 and the plurality of first transistors TR1. Each of the plurality of conductive lines 114 may be buried in an insulating structure IL1 that is disposed on the substrate 110. The insulating structure IL1 may include an oxide film. Each of the plurality of conductive lines 114 may be connected to the lower impurity region 116 of the first transistor TR. In example embodiments, as shown in FIG. 2B, a top surface of each of the plurality of conductive lines 114 may be in contact with the lower impurity region 116 of the first transistor TR1. Each of the plurality of conductive lines 114 may function as a bit line connected to the first transistor TR1.

In example embodiments, each of a plurality of lower impurity regions 116 and the plurality of first channel regions 124 may have an island-type planar structure. On a selected one of the plurality of conductive lines 114, the plurality of lower impurity regions 116 and the plurality of first channel regions 124, each of which is of the island type, may be arranged in a line extending in the second lateral direction (Y direction).

In other example embodiments, each of the plurality of lower impurity regions 116 may have a line-type planar structure, which extends in the second lateral direction (Y direction), similar to the plurality of conductive lines 114, and each of the plurality of first channel regions 124 may be on the lower impurity region 116 and have an island-type planar shape. On a selected one of the plurality of lower impurity regions 116 of the line type, the plurality of first channel regions 124 of the island type may be arranged in a line extending in the second lateral direction (Y direction).

As shown in FIGS. 2A and 2B, the plurality of second transistors TR2 may be at a second vertical level LV2, which is different from the first vertical level LV1. A distance from the substrate 110 to the second vertical level LV2 in the vertical direction (Z direction) may be greater than a distance from the substrate 110 to the first vertical level LV1 in the vertical direction (Z direction). Each of the plurality of second transistors TR2 may include a second channel region 142 and a second gate dielectric film 144, which are at the second vertical level LV2, and an upper conductive line 170, which is at a third vertical level LV3 that is different from the second vertical level LV2. A distance from the substrate 110 to the third vertical level LV3 in the vertical direction (Z direction) may be greater than a distance from the substrate 110 to the second vertical level LV2 in the vertical direction (Z direction). The upper conductive line 170 may operate as a common gate of the plurality of second transistors TR2, which are arranged in a line in the first lateral direction (X direction).

As shown in FIGS. 2A and 2B, each of the plurality of upper capacitors CPB may pass through the second transistor TR2 in the vertical direction (Z direction) in an inner space defined by the second channel region 142 of the second transistor TR2. Each of the plurality of upper capacitors CPB may include a lower electrode 152, a dielectric film 154, and an upper electrode 156, which are sequentially arranged from the second channel region 142 toward the center of the inner space. As used herein, the lower electrode 152 may be referred to as a "first electrode," and the upper electrode 156 may be referred to as a "second electrode." The upper conductive line 170 may function as a plate electrode of each of the plurality of upper capacitors CPB arranged in a line in the first lateral direction (X direction).

The lower electrode 152 of each of the plurality of upper capacitors CPB may be connected to the first transistor TR1 through the lower capacitor CPA, and the upper electrode 156 of each of the plurality of upper capacitors CPB may be connected to the upper conductive line 170. The lower electrode 152 of the upper capacitor CPB may be connected to the upper impurity region 126 of the first channel region 124 through the lower capacitor CPA.

The dielectric film 154 of each of the plurality of upper capacitors CPB may be between the lower electrode 152 and the upper electrode 156. Each of the lower electrode 152, the dielectric film 154, and the upper electrode 156 of the upper capacitor CPB may include a portion passing through the inner space defined by the second channel region 142 of the second transistor TR2 in the vertical direction (Z direction) and a portion between the inner space and the lower capacitor CPA. The components of the lower electrode 152, the dielectric film 154, and the upper electrode 156 of each of the plurality of upper capacitors CPB may be substantially the same as those of the first electrode 52, the dielectric film 54, and the second electrode 56 of the capacitor CP, which have been described with reference to FIGS. 1A and 1B.

The plurality of lower capacitors CPA may be at a vertical level between the first vertical level LV1 at which the plurality of first transistors TR1 are located and the second vertical level LV2 at which the plurality of second transistors TR2 are located. In example embodiments, each of the plurality of lower capacitors CPA may include a ferroelectric capacitor.

Each of the plurality of lower capacitors CPA may include a lower electrode 132, a ferroelectric film 134, and an upper electrode 136. As used herein, the lower electrode 132 may be referred to as a "third electrode," and the upper electrode 136 may be referred to as a "fourth electrode." The lower electrode 132 may be disposed on the first transistor TR1 and have a cylindrical shape to define a pillar-type space. The ferroelectric film 134 may be in the pillar-type space and in contact with an inner surface of the lower electrode 132. The upper electrode 136 may be on the ferroelectric film 134 in the pillar-type space. The upper electrode 136 may be spaced apart from the lower electrode 132 with the ferroelectric film 134 therebetween. A sidewall and a bottom surface of the upper electrode 136 may be surrounded by the lower electrode 132. The lower electrode 132 of each of the plurality of lower capacitors CPA may be connected to the upper impurity region 126 of the first transistor TR1. The upper electrode 136 of each of the plurality of lower capacitors CPA may be connected to the lower electrode 152 of the upper capacitor CPB. The lower electrode 152 of the upper capacitor CPB may be at a higher vertical level than the pillar-type space. A lowermost surface of the lower electrode 152 of the upper capacitor CPB may be outside the pillar-type space defined by the lower electrode 132 of the lower capacitor CPA.

The components of the lower electrode 132 and the upper electrode 136 of each of the plurality of lower capacitors CPA may be substantially the same as those of the first electrode 52 and the second electrode 56 of the capacitor CP, which have been described with reference to FIGS. 1A and 1B.

In example embodiments, the ferroelectric film 134 of each of the plurality of lower capacitors CPA may include at least one oxide selected from among hafnium (Hf), silicon (Si), aluminum (Al), zirconium (Zr), yttrium (Y), lanthanum (La), gadolinium (Gd), and strontium (Sr). The ferroelectric film 134 may further include a dopant as needed. The dopant may include at least one element selected from among silicon (Si), aluminum (Al), zirconium (Zr), yttrium (Y), lanthanum (La), gadolinium (Gd), scandium (Sc), strontium (Sr), magnesium (Mg), and barium (Ba).

In other example embodiments, the ferroelectric film 134 may include a hafnium-based oxide. For example, the ferroelectric film 134 may include hafnium oxide (HfM), hafnium zirconium oxide (HZO), hafnium titanium oxide, or hafnium silicon oxide. When the ferroelectric film 134 includes a hafnium-based oxide, the ferroelectric film 134 may further include a dopant including at least one element selected from among Si, Al, Zr, Y, La, Gd, Sc, Sr, Mg, and Ba.

In other example embodiments, the ferroelectric film 134 may have a stack structure including a plurality of ferroelectric sub-layers including different materials. Moreover, the ferroelectric film 134 may include a stack structure of at least one ferroelectric sub-layer and a dielectric layer. A constituent material of each of the ferroelectric sub-layers may be selected from the above-described examples of a constituent material of the ferroelectric film 134. The dielectric layer may include a silicon oxide film, a high-k dielectric film, or a combination thereof. The high-k dielectric film may include a metal oxide or a metal oxynitride having a higher dielectric constant than a silicon oxide film.

Each of the plurality of lower capacitors CPA may be surrounded by an insulating structure IL3. The insulating structure IL3 may include an oxide film.

As shown in FIGS. 2A and 2B, the second channel region 142 of the second transistor TR may have a cylindrical shape to define the inner space thereof, and the second gate dielectric film 144 may cover an inner surface of the second channel region 142. The components of the second channel region 142 and the second gate dielectric film 144 may be substantially the same as those of the channel region 42 and the gate dielectric film 44 described with reference to FIGS. 1A and 1B.

The semiconductor memory device 100 may include a plurality of conductive lines 158. Two of the plurality of conductive lines 158 may be connected to the second channel region 142 of the second transistor TR2. One of the two conductive lines 158 may be connected to one second channel region 142 and may function as a bit line connected to the second transistor TR2, and the other one of the two conductive lines 158 may function as a source line connected to the second transistor TR2. The components of the plurality of conductive lines 158 may be substantially the same as those of the first conductive line CL1 and the second conductive line CL2 described with reference to FIGS. 1A and 1B.

The second transistor TR2 and the upper capacitor CPB may be covered by an insulating structure IL4 arranged in the vicinities thereof. The insulating structure IL4 may include an oxide film.

The plurality of upper conductive lines 170 may extend in the first lateral direction (X direction) on the insulating structure IL4. Each of the plurality of upper conductive lines 170 may be at a higher level than the upper capacitor CPB. Each of the plurality of upper conductive lines 170 may be connected to the upper electrode of the upper capacitor CPB through a contact portion 170C. Each of the plurality of upper conductive lines 170 may be connected to the second gate dielectric film 144 of the second transistor TR2 through the upper capacitor CPB. Each of the plurality of upper conductive lines 170 may function as a plate electrode in the plurality of upper capacitors CPB arranged in a line in the first lateral direction (X direction), and function as a gate electrode in the plurality of second transistors TR2 arranged in a line extending in the first lateral direction (X direction). The components of the plurality of upper conductive lines 170 may be substantially the same as those of the third conductive line CL3 described with reference to FIGS. 1A and 1B.

In the semiconductor memory device 100 described with reference to FIGS. 2A to 2D, each of the plurality of memory cells MC may include a 2T-2C memory cell including two transistors and two capacitors, namely, one first transistor TR1, one second transistor TR2, one lower capacitor CPA, and one upper capacitor CPB. Accordingly, in typical ferroelectric memory devices, the problem of destructive reading of a memory cell and the problem of durability caused by a premature failure may be solved. In addition, each of the plurality of upper capacitors CPB may have a structure, which passes through the second transistor TR2 in the vertical direction (Z direction) in the inner space defined by the second channel region 142 of the second transistor TR2. As such, in accordance with the downscaling trend of semiconductor devices, the plurality of memory cells MC may be reduced in size to occupy less area in the semiconductor memory device 100, and thus, the integration density of the semiconductor memory device 100 may be increased.

Figure 3A:
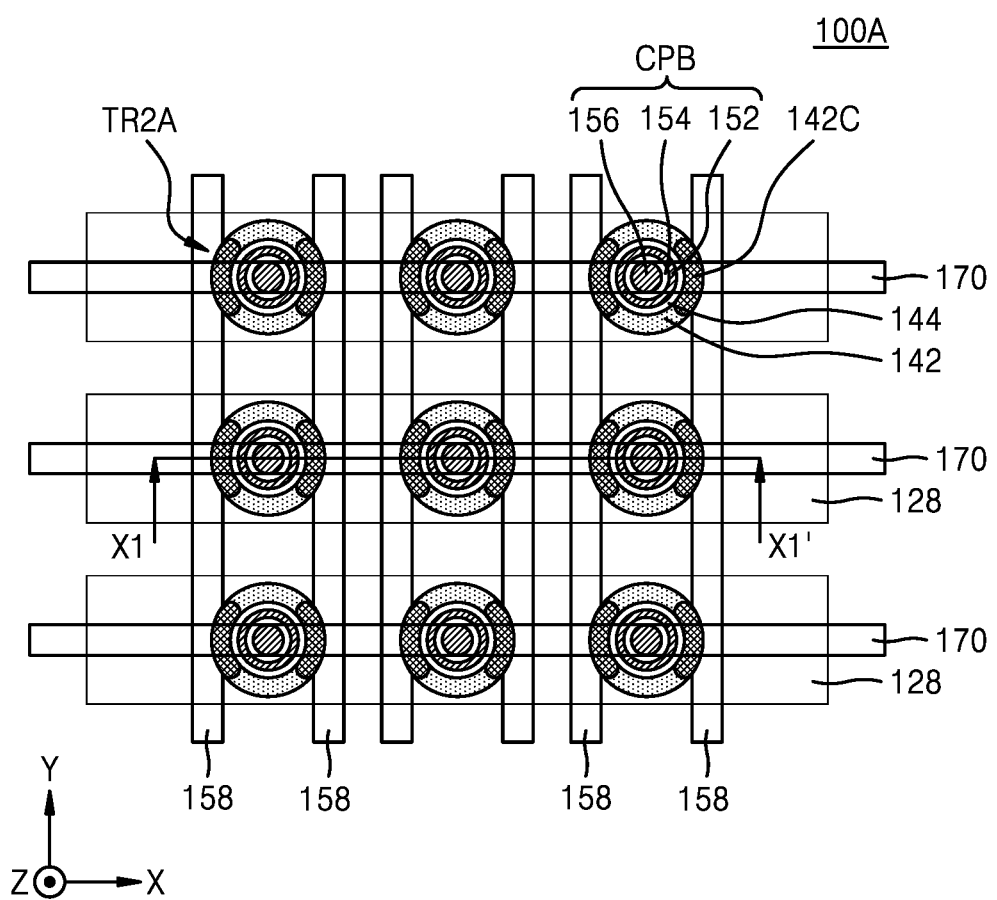
FIG. 3A is a plan view diagram of a semiconductor memory device according to an embodiment.
Figure 3B:
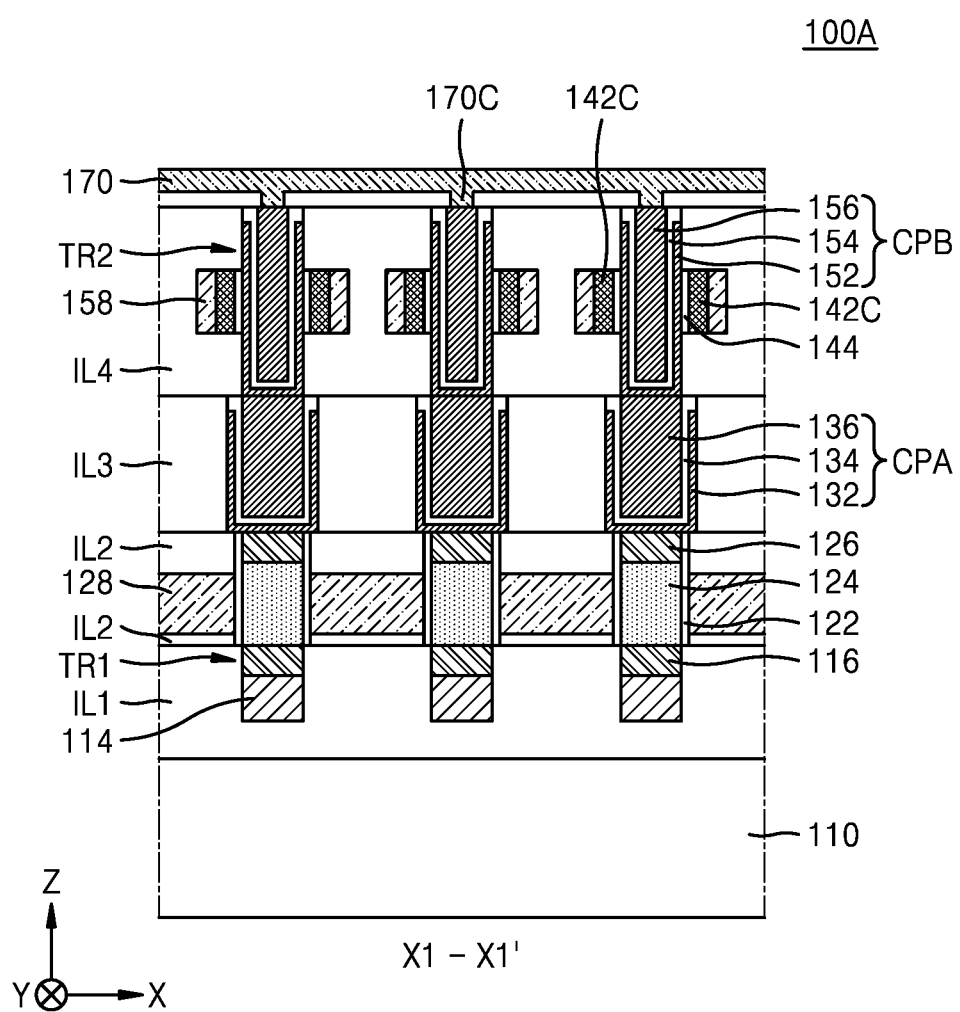
FIG. 3B is a cross-sectional view taken along a line X1-X1' of FIG. 3A.

FIG. 3A is a plan view diagram of a semiconductor memory device 100A according to an embodiment. FIG. 3B is a cross-sectional view taken along a line X1-X1' of FIG. 3A. In FIGS. 3A and 3B, the same reference numerals are used to denote the same elements as in FIGS. 2A to 2D, and detailed descriptions thereof are omitted.

Referring to FIGS. 3A and 3B, the semiconductor memory device 100A may have substantially the same configuration as the semiconductor memory device 100 described with reference to FIGS. 2A to 2D. However, the semiconductor memory device 100A may include a plurality of second transistors TR2A instead of the plurality of second transistors TR2. Although the plurality of second transistors TR2A may have substantially the same configuration as the plurality of second transistors TR2, a second channel region 142 of each of the plurality of second transistors TR2A may include an ohmic contact portion 142C in contact with a conductive line 158. As shown in FIGS. 3A and 3B, when one second channel region 142 is in contact with two conductive lines 158, one second channel region 142 may include two ohmic contact portions 142C. The ohmic contact portion 142C may have a higher dopant concentration than the other portion of the second channel region 142.

Figure 4A:
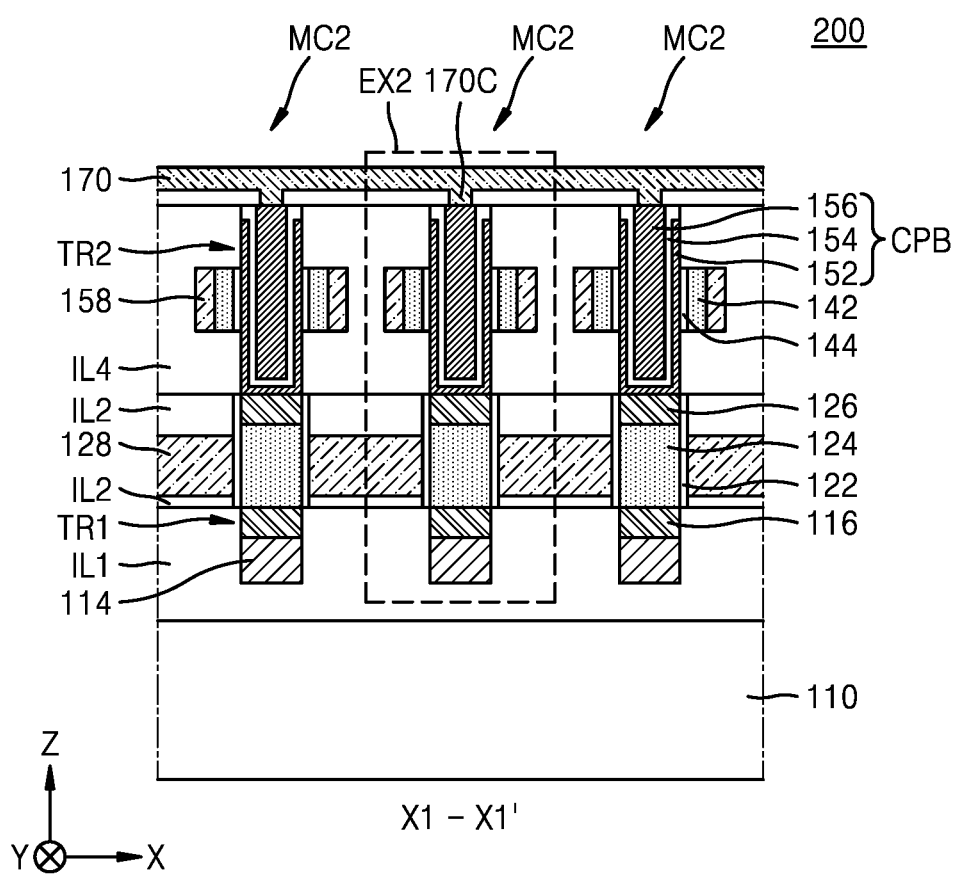
FIG. 4A is a cross-sectional view of a semiconductor memory device according to an embodiment.
Figure 4B:
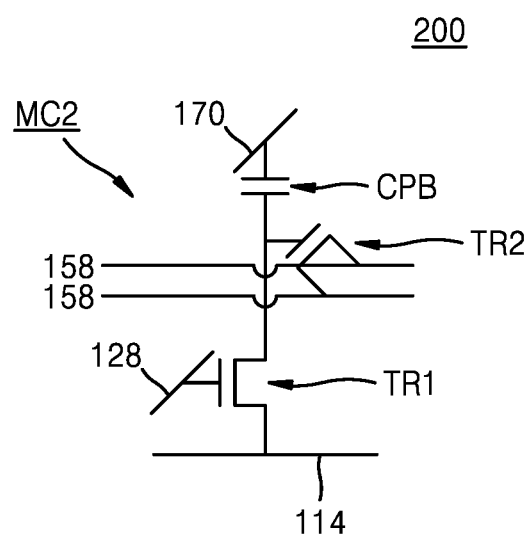
FIG. 4B is a circuit diagram of a memory cell shown in FIG. 4A.

FIG. 4A is a cross-sectional view a semiconductor memory device 200 according to an embodiment. FIG. 4A illustrates a portion corresponding to a cross-section taken along the line X1-X1' of FIG. 2A. FIG. 4B is a circuit diagram of a memory cell MC2 corresponding to a region EX2 illustrated with a dashed line in FIG. 4A. In FIGS. 4A and 4B, the same reference numerals are used to denote the same elements as in FIGS. 2A to 2D, and detailed descriptions thereof are omitted.

Referring to FIGS. 4A and 4B, the semiconductor memory device 200 may have substantially the same configuration as the semiconductor memory device 100 described with reference to FIGS. 2A to 2D. However, the semiconductor memory device 200 may not include a plurality of lower capacitors CPA and an insulating structure IL3 configured to surround the plurality of lower capacitors CPA. In the semiconductor memory device 200, a lower electrode 152 of each of the plurality of upper capacitors CPB may be directly connected to an upper impurity region 126.

FIGS. 5A to 5D are plan view diagrams of semiconductor memory devices 300A, 300B, and 300C according to embodiments. Some components on a plane taken at the first vertical level LV1 of FIG. 2B are illustrated in each of FIGS. 5A to 5D, and planar positions of a plurality of conductive lines 114 are illustrated with dashed lines for brevity. In FIGS. 5A to 5D, the same reference numerals are used to denote the same elements as in FIGS. 2A to 2D, and detailed descriptions thereof are omitted.

Figure 5A:
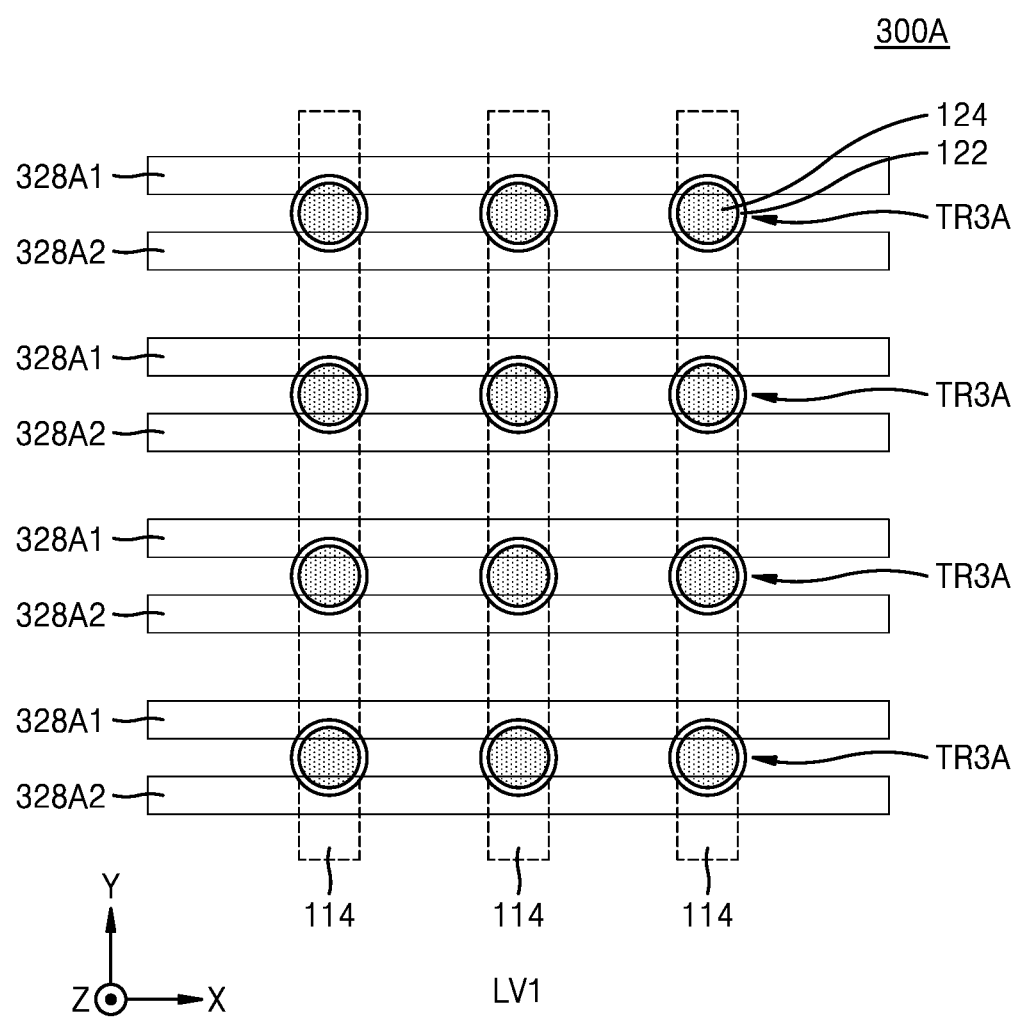
FIGS. 5A to 5D are plan view diagrams of a semiconductor memory device according to embodiments.

Referring to FIG. 5A, the semiconductor memory device 300A may have substantially the same configuration as the semiconductor memory device 100 described with reference to FIGS. 2A to 2D. However, the semiconductor memory device 300A may include a plurality of first transistors TR3A instead of the plurality of first transistors TR1. Each of the plurality of first transistors TR3A may include a first channel region 124 located at the first vertical level LV1 and a plurality of pairs of conductive lines (e.g., 328A1 and 328A2) located adjacent to the first channel region 124 at the first vertical level LV1.

Each of the plurality of pairs of conductive lines (e.g., 328A1 and 328A2) may have a surface facing the first channel region 124. A first gate dielectric film 122 may be between the plurality of pairs of conductive lines (e.g., 328A1 and 328A2) and the first channel region 124. Each of the plurality of pairs of conductive lines (e.g., 328A1 and 328A2) may be spaced apart from the first channel region 124 with the first gate dielectric film 122 therebetween.

Each of the plurality of pairs of conductive lines (e.g., 328A1 and 328A2) may include a first conductive line 328A1 and a second conductive line 328A2, which are adjacent to one first channel region 124 and face each other with the one first channel region 124 therebetween. Each of the first conductive line 328A1 and the second conductive line 328A2 may constitute a gate or a word line of the first transistor TR3A. Each of the plurality of first transistors TR3A may provide a double gate structure including two gates.

Each of the plurality of pairs of conductive lines (e.g., 328A1 and 328A2) may have a structure that extends in a first lateral direction (X direction). Each of the plurality of pairs of conductive lines (e.g., 328A1 and 328A2) may operate as a common gate or a common word line of the plurality of first transistors TR3A arranged in a line in the first lateral direction (X direction). The components of each of the plurality of pairs of conductive lines (e.g., 328A1 and 328A2) may be substantially the same as those of the conductive line 128 described with reference to FIGS. 2A to 2D.

Figure 5B:
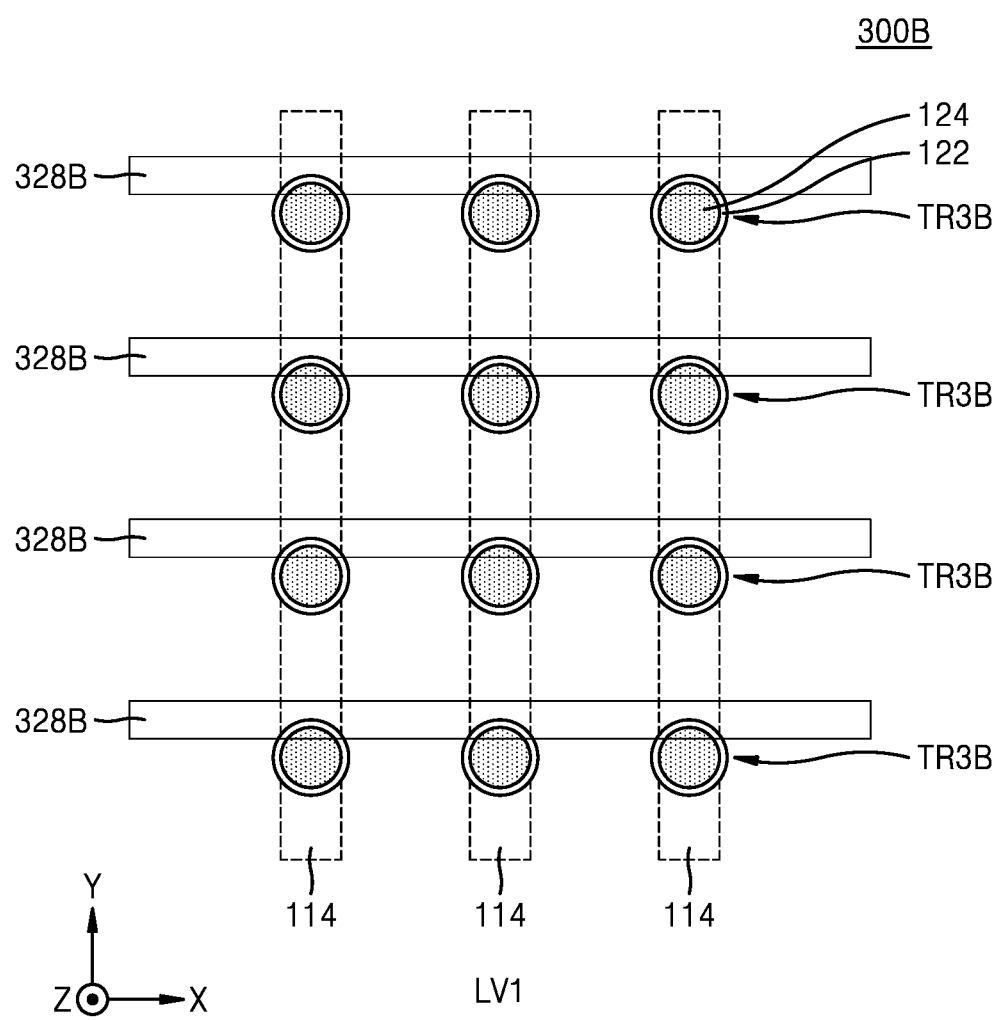

Referring to FIG. 5B, the semiconductor memory device 300B may have substantially the same configuration as the semiconductor memory device 100 described with reference to FIGS. 2A to 2D. However, the semiconductor memory device 300B may include a plurality of first transistors TR3B instead of the plurality of first transistors TR1. Each of the plurality of first transistors TR3B may include a first channel region 124 located at a first vertical level LV1 and a plurality of conductive lines 328B located adjacent to the first channel region 124 at the first vertical level LV1.

Each of the plurality of conductive lines 328B may have a surface facing the first channel region 124. A first gate dielectric film 122 may be between the plurality of conductive lines 328B and the first channel region 124. The plurality of conductive lines 328B may be spaced apart from the first channel region 124 with the first gate dielectric film 122 therebetween.

One first channel region 124 may be adjacent to a selected one of the plurality of conductive lines 328B. Each of the plurality of conductive lines 328B may be a gate or a word line of the first transistor TR3B. Each of the plurality of first transistors TR3B may provide a single gate structure including one gate.

Each of the plurality of conductive lines 328B may have a structure, which extends in a first lateral direction (X direction). The plurality of first transistors TR3B may include a plurality of groups of first transistors TR3B, which are arranged in a line extending in the first lateral direction (X direction), and a selected one of the plurality of conductive lines 328B may operate as a common gate or a common word line of one group of the first transistors TR3B, which are arranged in a line extending in the first lateral direction (X direction). The conductive lines 328B respectively included in the plurality of groups of first transistors TR3B may face side surfaces in the same direction, from among side surfaces of the plurality of first channel regions 124 included in the plurality of groups of first transistors TR3B. More specifically, each of the plurality of conductive lines 328B may face a side surface of one end portion of the first channel region 124 in a second lateral direction (Y direction). Accordingly, in a first group of the first transistors TR3B and a second group of the first transistors TR3B, which are selected from the plurality of groups of first transistors TR3B and adjacent to each other in the second lateral direction (Y direction), the first conductive lines 328B may be at the same position. Also, the first group of the first transistors TR3B and the second group of the first transistors TR3B may have the same structure when viewed from the Z direction. The configurations of each of the plurality of conductive lines 328B may be substantially the same as those of the conductive line 128 described with reference to FIGS. 2A to 2D.

Figure 5C:
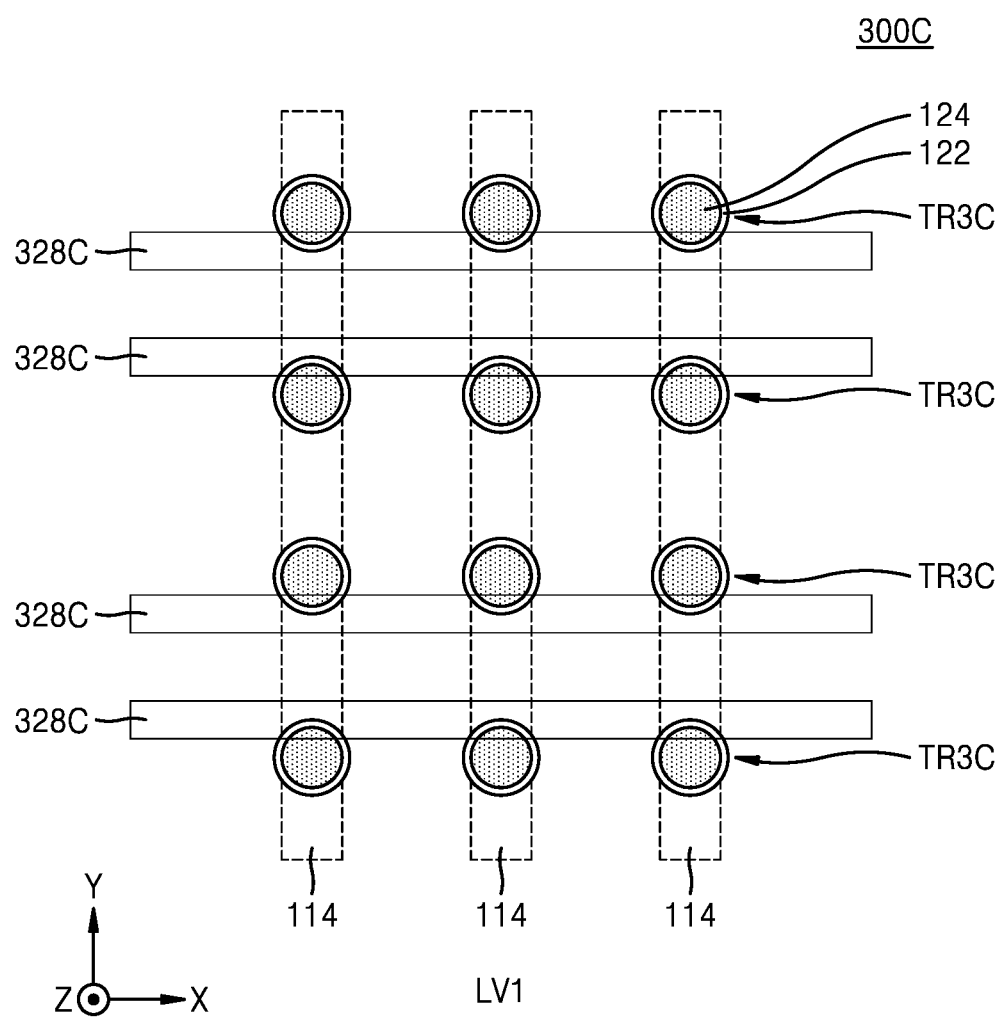

Referring to FIG. 5C, the semiconductor memory device 300C may have substantially the same configuration as the semiconductor memory device 100 described with reference to FIGS. 2A to 2D. However, the semiconductor memory device 300C may include a plurality of first transistors TR3C instead of the plurality of first transistors TR1. Each of the plurality of first transistors TR3C may include a first channel region 124 located at a first vertical level LV1 and a plurality of conductive lines 328C located adjacent to the first channel region 124 at the first vertical level LV1.

Each of the plurality of conductive lines 328C may have a surface facing the first channel region 124. A first gate dielectric film 122 may be between the plurality of conductive lines 328C and the first channel region 124. The plurality of conductive lines 328C may be spaced apart from the first channel region 124 with the first gate dielectric film 122 therebetween.

One first channel region 124 may be adjacent to a selected one of the plurality of conductive lines 328C. Each of the plurality of conductive lines 328C may be a gate or a word line of the first transistor TR3C. Each of the plurality of first transistors TR3C may provide a single gate structure including one gate.

Each of the plurality of conductive lines 328C may have a structure, which extends in a first lateral direction (X direction). The plurality of first transistors TR3C may include a plurality of groups of first transistors TR3C, which are arranged in a line in the first lateral direction (X direction), and a selected one of the plurality of conductive lines 328C may operate as a common gate or a common word line of one group of first transistors TR3C, which are arranged in a line in the first lateral direction (X direction).

Each of the plurality of conductive lines 328C may face a side surface of one end portion of the first channel region 124 or a side surface of another end portion thereof in a second lateral direction (Y direction). More specifically, in a first group of the first transistors TR3C and a second group of the first transistors TR3C, which are selected from the plurality of groups of the first transistors TR3C arranged in a line in the first lateral direction (X direction) and are adjacent to each other in the second lateral direction (Y direction), the first conductive lines 328C may be at different positions. Also, the first group of first transistors TR3C and the second group of first transistors TR3C may be in mirror-image relations about a straight line in the first lateral direction (X direction) when viewing an X-Y plane from the Z direction. The components of each of the plurality of conductive lines 328C may be substantially the same as those of the conductive 128 described with reference to FIGS. 2A to 2D.

Figure 5D:
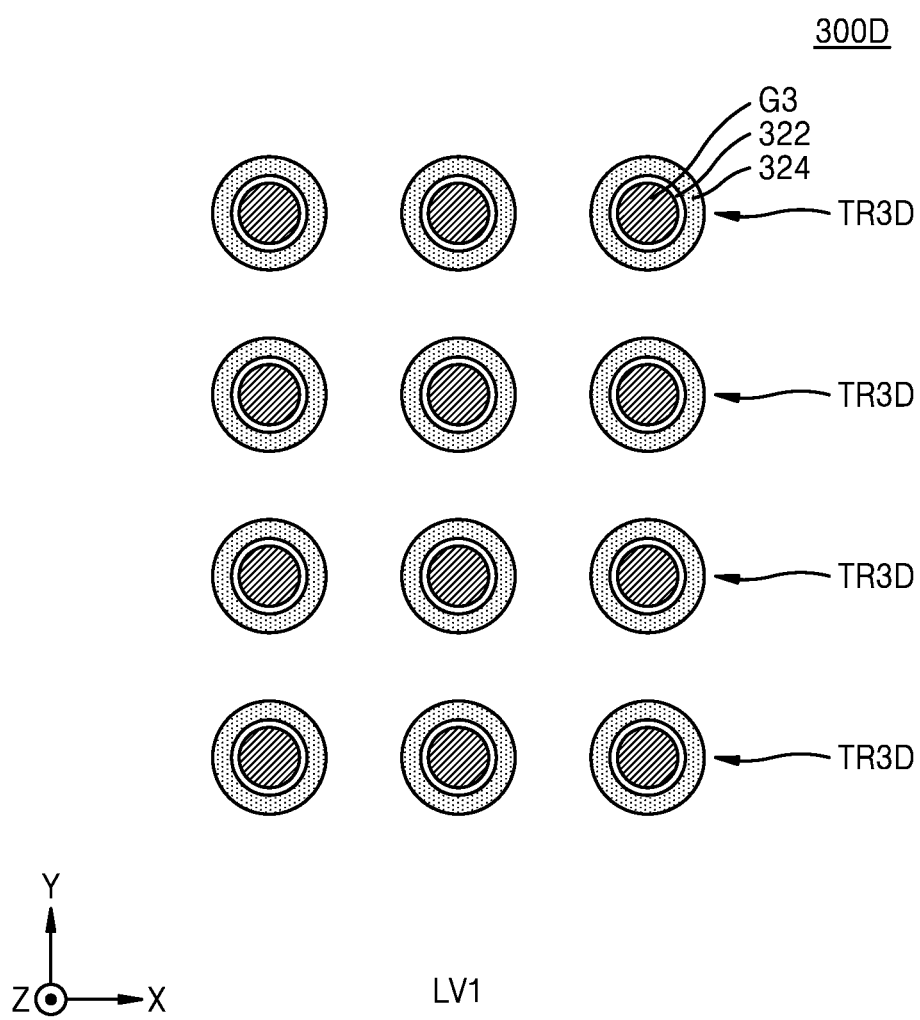

Referring to FIG. 5D, the semiconductor memory device 300D may have substantially the same configuration as the semiconductor memory device 100 described with reference to FIGS. 2A to 2D. However, the semiconductor memory device 300D may include a plurality of first transistors TR3D instead of the plurality of first transistors TR1.

Each of the plurality of first transistors TR3D may include an inner gate G3 located at a first vertical level LV1, a first channel region 324 surrounding the inner gate G3 at the first vertical level LV1, and a first gate dielectric film 322 between the inner gate G3 and the first channel region 324. Functions and constituent materials of the inner gate G3, the first channel region 324, and the first gate dielectric film 322 may be respectively and substantially the same as those of the conductive line 128, the first channel region 124, and the first gate dielectric film 122, which have been described with reference to FIG. 2B.

Although examples of the first transistors TR3A, TR3B, TR3C, and TR3D located at the first vertical level LV1 in the semiconductor memory devices 300A, 300B, 300C, and 300D according to the embodiments have been described above with reference to FIGS. 5A to 5D, the inventive concept is not limited thereto. For example, in a semiconductor memory device according to embodiments, at least some of a plurality of first transistors located at the first vertical level LV1 may include a transistor having a planar channel structure in which a channel is formed along a top surface of the substrate 110 (refer to FIG. 2B); a transistor having a recess channel structure in which a channel is formed along a surface of a recess trench formed in the substrate 110; a fin field-effect transistor (FinFET) including a fin-type active region on the substrate 110, a gate covering a top surface and both sidewalls of the fin-type active region, and a gate dielectric film between the fin-type active region and the gate; a multi-bridge channel FET (MBCFET) including at least one nanosheet channel region on the substrate 110, a gate surrounding the nanosheet channel region, and a gate dielectric film between the nanosheet channel region and the gate; or a transistor having a structure obtained by variously modifying and changing the transistors described above.

Figure 6:
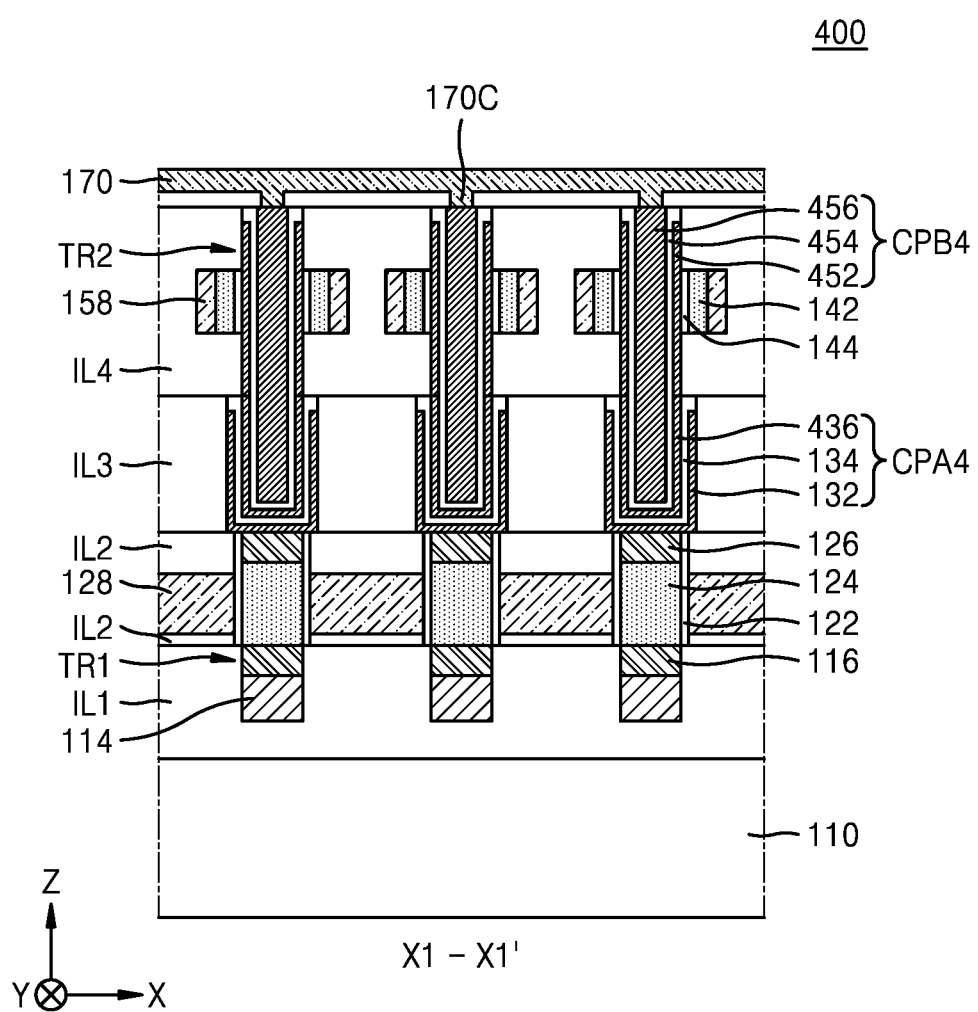
FIGS. 6 to 10 are cross-sectional views of a semiconductor memory device according to embodiments.

FIG. 6 is a cross-sectional view of a semiconductor memory device 400 according to an embodiment. FIG. 6 illustrates some components of a portion corresponding to a cross-section taken along line X1-X1' of FIG. 2A. In FIG. 6, the same reference numerals are used to denote the same elements as in FIGS. 2A to 2D, and detailed descriptions thereof are omitted.

Referring to FIG. 6, the semiconductor memory device 400 may have substantially the same configuration as the semiconductor memory device 100 described with reference to FIGS. 2A to 2D. However, the semiconductor memory device 400 may include a plurality of lower capacitors CPA4 and a plurality of upper capacitors CPB4 instead of the plurality of lower capacitors CPA and the plurality of upper capacitors CPB.

Each of the plurality of lower capacitors CPA4 may be a ferroelectric capacitor. Each of the plurality of lower capacitors CPA4 may include a lower electrode 132, a ferroelectric film 134, and an upper electrode 436.

Each of the plurality of upper capacitors CPB4 may include a lower electrode 452, a dielectric film 454, and an upper electrode 456, which are sequentially arranged from a second channel region 142 toward the center of an inner space defined by the second channel region 142. Each of the plurality of upper capacitors CPB4 may include a first local portion and a second local portion. The first local portion may pass through the inner space defined by the second channel region 142. The second local portion may be inserted into a pillar-type space defined by the lower electrode 132 of each of the plurality of lower capacitors CPA4. Each of the lower electrode 452, the dielectric film 454, and the upper electrode 456 of each of the plurality of upper capacitors CPB4 may have a portion included in the first local portion and a portion included in the second local portion. The lower electrode 452 of each of the plurality of upper capacitors CPB4 may be integrally formed with the upper electrode 436 of each of the plurality of lower capacitors CPA4. That is, the lower electrode 452 of each of the plurality of upper capacitors CPB4 may be connected to the upper electrode 436 of each of the plurality of lower capacitors CPA4.

The ferroelectric film 134 of each of the plurality of lower capacitors CPA4 may be in the pillar-type space and include a portion in contact with an inner surface of the lower electrode 132 and a portion in contact with an outer surface of the lower electrode 452 of the upper capacitor CPB4. A lower sidewall and a bottom surface of the lower electrode 452 of the upper capacitor CPB4 may be surrounded by the ferroelectric film 134 of the lower capacitor CPA4. A lowermost surface of the lower electrode 452 of the upper capacitor CPB4 may be in the pillar-type space defined by the lower electrode 132 of the lower capacitor CPA4.

The components of the lower electrode 452, the dielectric film 454, and the upper electrode 456 of each of the plurality of upper capacitors CPB4 may be substantially the same as those of the first electrode 52, the dielectric film 54, and the second electrode 56 of the capacitor CP, which have been described with reference to FIGS. 1A and 1B.

Figure 7:
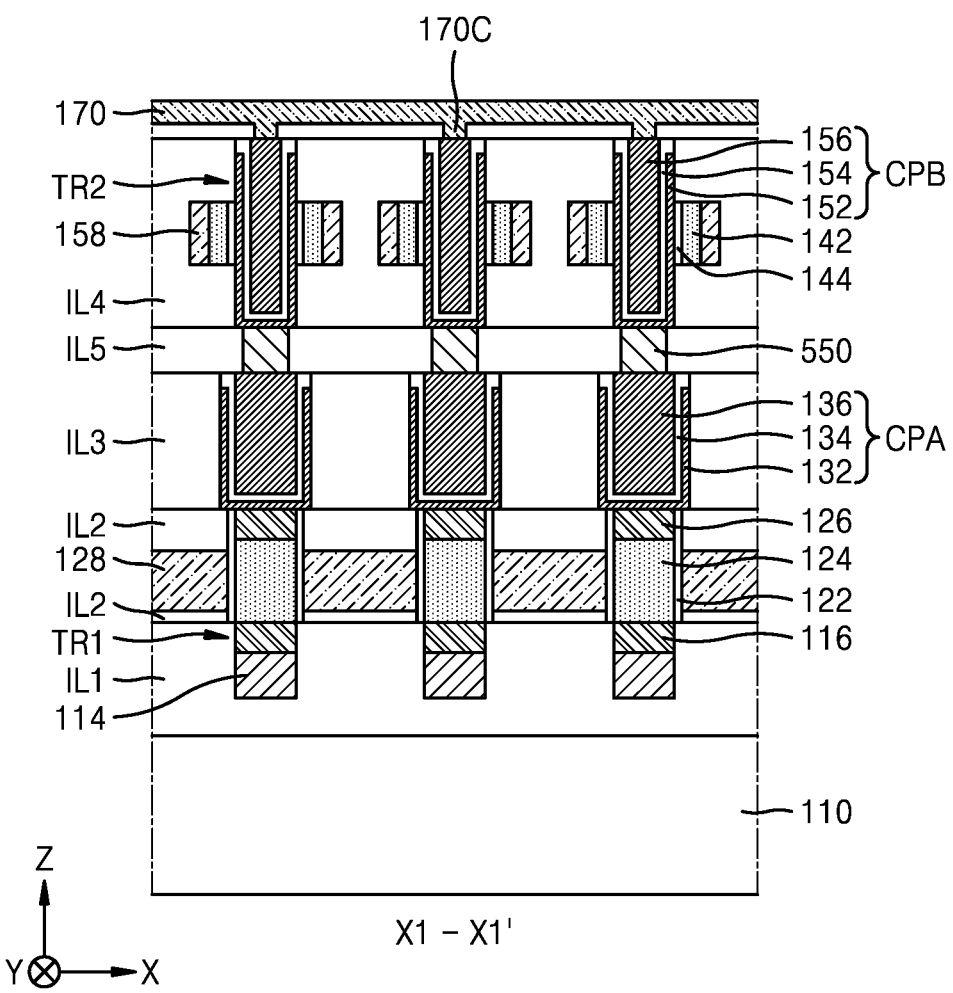

FIG. 7 is a cross-sectional view of a semiconductor memory device 500 according to an embodiment. FIG. 7 illustrates a portion corresponding to a cross-section taken along the line X1-X1' of FIG. 2A. In FIG. 7, the same reference numerals are used to denote the same elements as in FIGS. 2A to 2D, and detailed descriptions thereof are omitted.

Referring to FIG. 7, the semiconductor memory device 500 may have substantially the same configuration as the semiconductor memory device 100 described with reference to FIGS. 2A to 2D. However, the semiconductor memory device 500 may further include a plurality of contact plugs 550 between a plurality of lower capacitors CPA and a plurality of upper capacitors CPB.

Each of the plurality of contact plugs 550 may have a bottom surface in contact with an upper electrode 136 of the lower capacitor CPA and a top surface in contact with a lower electrode 152 of the upper capacitor CPB. A sidewall of each of the plurality of contact plugs 550 may be surrounded by an insulating structure IL5. The insulating structure IL5 may include an oxide film.

Each of the plurality of contact plugs 550 may include W, Al, Cu, Mo, Ti, Co, Ta, Ni, tungsten silicide, titanium silicide, cobalt silicide, tantalum silicide, nickel silicide, or a combination thereof. For example, each of the plurality of contact plugs 550 may include a metal pattern including W, Al, or Cu and a conductive barrier film surrounding the metal pattern. The conductive barrier film may include Ti, TiN, Ta, TaN, or a combination thereof.

In example embodiments, to manufacture the semiconductor memory device 500 including the plurality of contact plugs 550, a lower structure including a plurality of first transistors TR1 and the plurality of lower capacitors CPA may be formed on a substrate 110, and the plurality of contact plugs 550 and the insulating structure IL5 surrounding the plurality of contact plugs 550 may be formed on the lower structure. Thereafter, a plurality of second transistors TR2, the plurality of upper capacitors CPB, and an insulating structure IL4, which surrounds the plurality of second transistors TR2 and the plurality of upper capacitors CPB, may be formed on the plurality of contact plugs 550 and the insulating structure IL5, and a plurality of upper conductive lines 170 may be formed on the insulating structure IL4.

In other example embodiments, a bonding process may be used to manufacture the semiconductor memory device 500 including the plurality of contact plugs 550. For example, to manufacture the semiconductor memory device 500 including the plurality of contact plugs 550, the lower structure including the plurality of first transistors TR1 and the plurality of lower capacitors CPA may be formed on the substrate 110. In addition, an upper structure including the plurality of second transistors TR2, the plurality of upper capacitors CPB, and the plurality of upper conductive lines 170 may be formed. Afterwards, a plurality of bonding metal patterns may be formed in at least one of the lower structure or the upper structure. Thereafter, the lower structure may be bonded to the upper structure by using the plurality of bonding metal patterns, and thus, the semiconductor memory device 500 having the structure shown in FIG. 7 may be manufactured.

Figure 8:
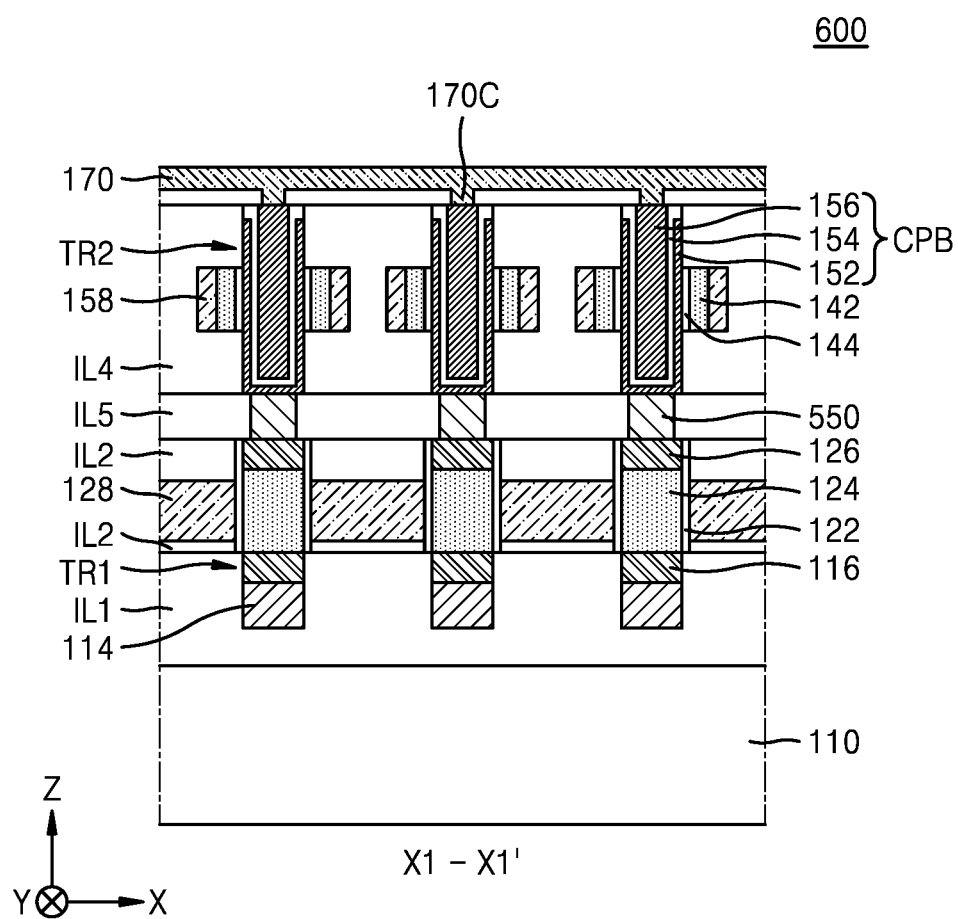

FIG. 8 is a cross-sectional view of a semiconductor memory device 600 according to an embodiment. FIG. 8 illustrates some components of a portion corresponding to a cross-section taken along the line X1-X1' of FIG. 2A. In FIG. 8, the same reference numerals are used to denote the same elements as in FIGS. 2A to 2D and 7, and detailed descriptions thereof are omitted.

Referring to FIG. 8, the semiconductor memory device 600 may have substantially the same configuration as the semiconductor memory device 500 described with reference to FIG. 7. However, the semiconductor memory device 600 may not include a plurality of lower capacitors CPA and an insulating structure IL3 configured to surround the plurality of lower capacitors CPA. In the semiconductor memory device 600, a lower electrode 152 of each of a plurality of upper capacitors CPB may be connected to an upper impurity region 126 of a first transistor TR1 through a contact plug 550.

Figure 9:
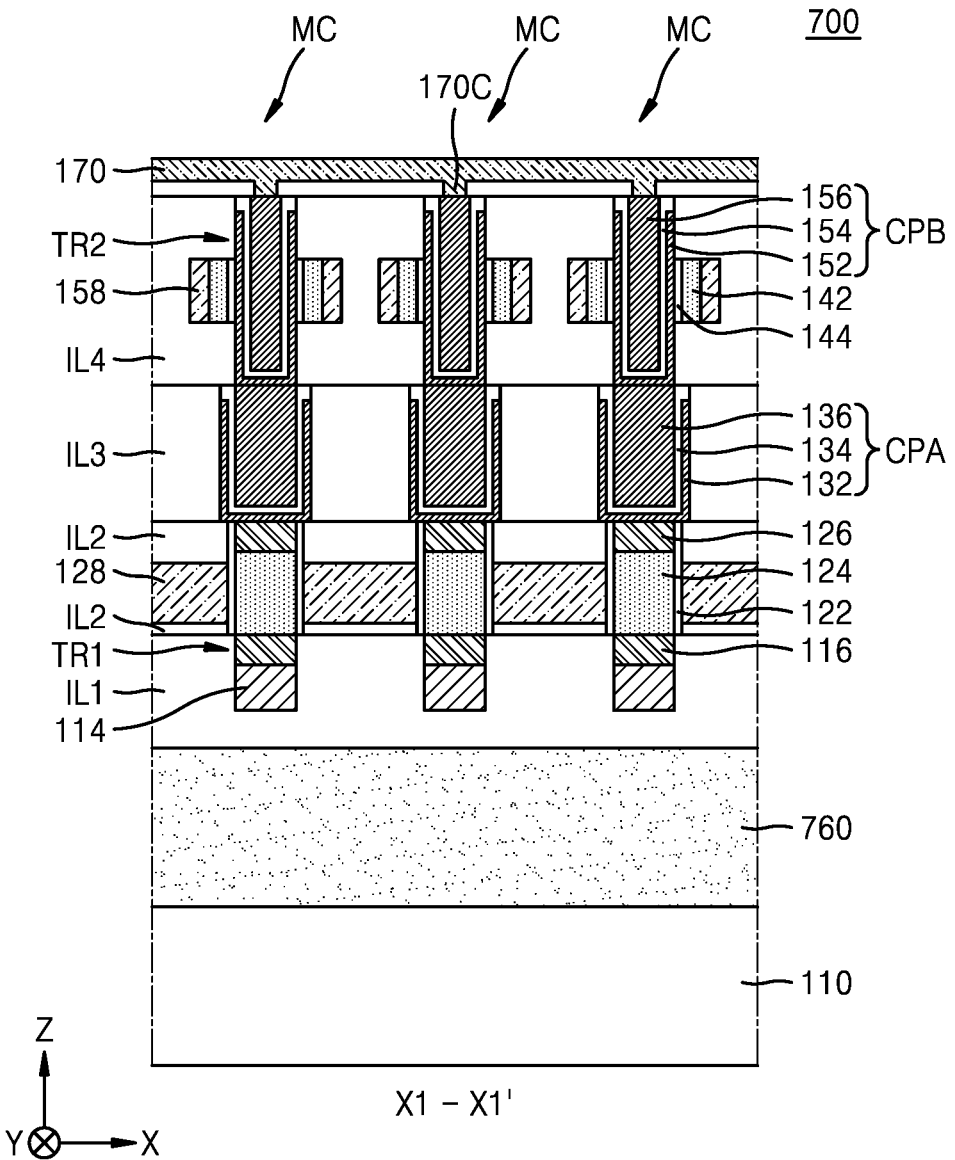

FIG. 9 is a cross-sectional view of a semiconductor memory device 700 according to an embodiment. FIG. 9 illustrates a portion corresponding to a cross-section taken along the line X1-X1' of FIG. 2A. In FIG. 9, the same reference numerals are used to denote the same elements as in FIGS. 2A to 2D, and detailed descriptions thereof are omitted.

Referring to FIG. 9, the semiconductor memory device 700 may have substantially the same configuration as the semiconductor memory device 100 described with reference to FIGS. 2A to 2D. However, the semiconductor memory device 700 may further include a driving circuit region 760 between a substrate 110 and an insulating structure IL1. The semiconductor memory device 700 may have a cell-on-peri (COP) structure in which a plurality of memory cells MC are arranged on the driving circuit region 760.

More specifically, the semiconductor memory device 700 may include the driving circuit region 760 disposed on the substrate 110 and the plurality of memory cells MC at a higher level than a vertical level at which the driving circuit region 760 is arranged on the substrate 110. Each of the plurality of memory cells MC may include a first transistor TR1, a second transistor TR2, a lower capacitor CPA, and an upper capacitor CPB.

The driving circuit region 760 may be a region in which peripheral circuits or driving circuits configured to drive the plurality of memory cells MC are arranged. The peripheral circuits arranged in the driving circuit region 760 may be circuits capable of processing data input/output to drive the plurality of memory cells MC at a high speed. In example embodiments, the peripheral circuits may include a page buffer, a latch circuit, a cache circuit, a column decoder, a sense amplifier, a data in/out circuit or a row decoder. The driving circuit region 760 may include a plurality of transistors TR and a multi-layered wiring structure electrically connected to the plurality of transistors TR.

In the semiconductor memory device 700, the driving circuit region 760 may overlap the plurality of memory cells MC in a vertical direction (Z direction), and thus, the integration density of the semiconductor memory device 700 may be further increased.

Figure 10:
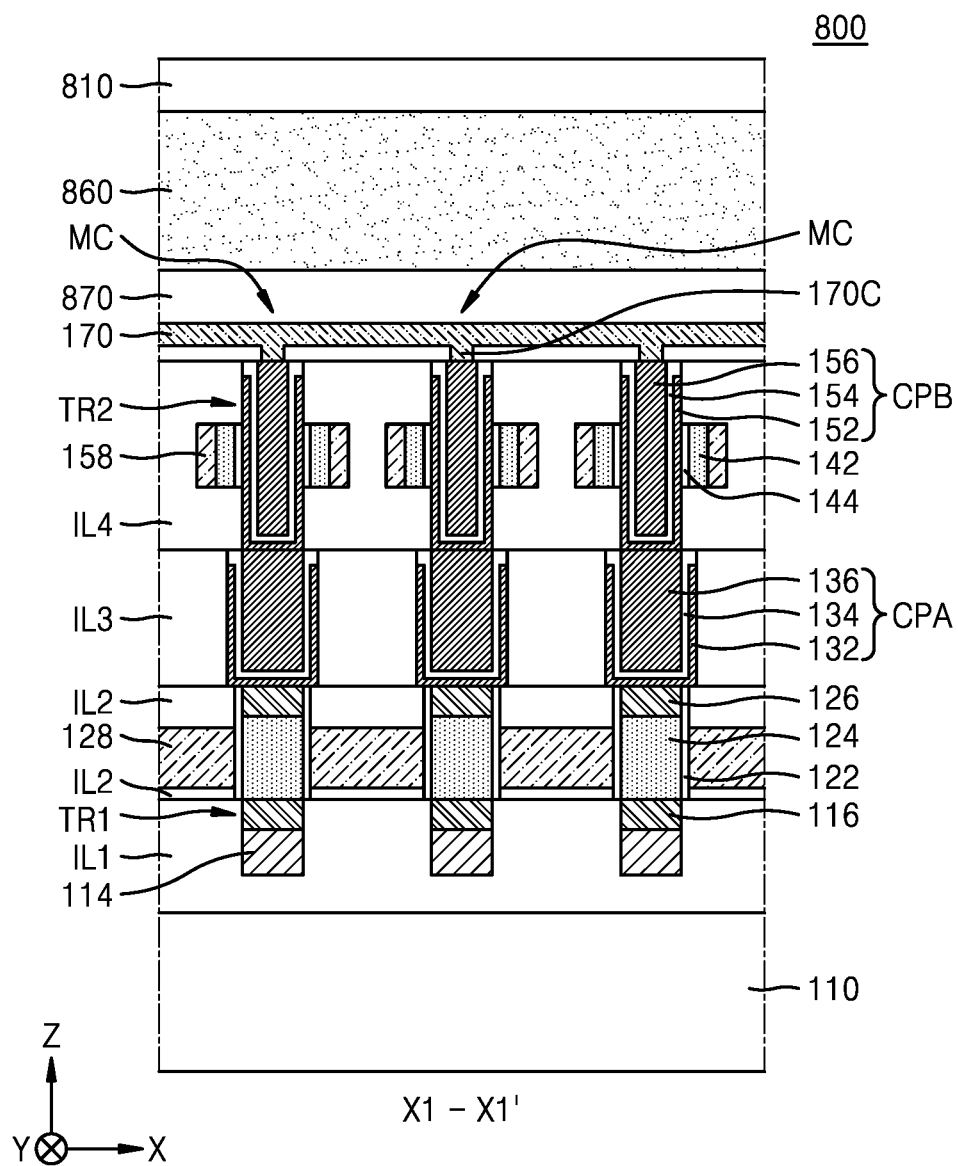

FIG. 10 is a cross-sectional view of a semiconductor memory device 800 according to an embodiment. FIG. 10 illustrates some components of a portion corresponding to a cross-section taken along line X1-X1' of FIG. 2A. In FIG. 10, the same reference numerals are used to denote the same elements as in FIGS. 2A to 2D, and detailed descriptions thereof are omitted.

Referring to FIG. 10, the semiconductor memory device 800 may have substantially the same configuration as the semiconductor memory device 100 described with reference to FIGS. 2A to 2D. However, the semiconductor memory device 800 may further include a driving circuit region 860 disposed on a plurality of upper conductive lines 170. In the semiconductor memory device 800, a plurality of memory cells MC may overlap the driving circuit region 860 in a vertical direction (Z direction).

A peripheral circuit substrate 810 may be disposed on the driving circuit region 860, and an insulating film 870 may be disposed between the plurality of upper conductive lines 170 and the driving circuit region 860. The peripheral circuit substrate 810 may have substantially the same configuration as the substrate 12 described with reference to FIG. 1B. The insulating film 870 may include an oxide film.

In example embodiments, to manufacture the semiconductor memory device 800 shown in FIG. 10, a lower structure including the plurality of memory cells MC may be formed on the substrate 110, an upper structure including the driving circuit region 860 may be formed on the peripheral circuit substrate 810, and a process of bonding the lower structure to the upper structure may be performed. However, the inventive concept is not limited thereto, and the semiconductor memory device 800 shown in FIG. 10 may be manufactured using various methods within the scope of the inventive concept.

Next, a method of manufacturing a semiconductor memory device according to embodiments will be described in detail.

FIGS. 11A to 27 are diagrams illustrating a method of manufacturing a semiconductor memory device, according to example embodiments. Specifically, FIGS. 11A, 12A, 13A, 14A, 21A, 23A, 24A, and 25A are plan views illustrating operations of manufacturing the semiconductor memory device, and FIGS. 11B, 12B, 13B, 14B, 15 to 20, 21B, 22, 23B, 24B, 25B, 26, and 27 are cross-sectional views illustrating operations of manufacturing the semiconductor memory device, according to an example embodiment. FIGS. 11B, 12B, 13B, 14B, 21B, 23B, 24B, and 25B are cross-sectional views taken along lines X1-X1' of FIGS. 11A, 12A, 13A, 14A, 21A, 23A, 24A, and 25A, respectively. Methods of manufacturing the semiconductor memory device 100 described with reference to FIGS. 2A to 2D and the semiconductor memory device 100A described with reference to FIGS. 3A and 3B, according to example embodiments, will be described with reference to FIGS. 11A to 27. In FIGS. 11A to 27, the same reference numerals are used to denote the same elements as in FIGS. 2A to 2D, and detailed descriptions thereof are omitted.

Figure 11A:
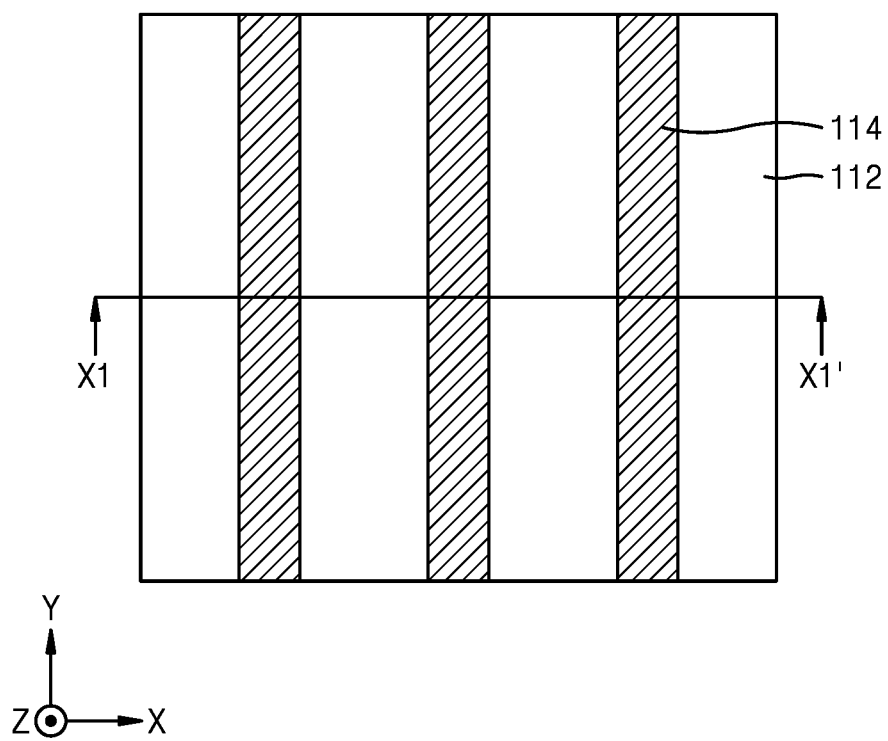
Figure 11B:
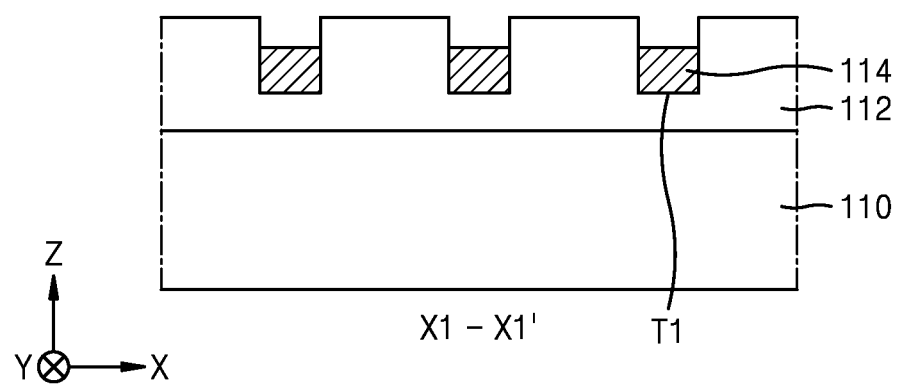

Referring to FIGS. 11A and 11B, an interlayer insulating film 112 may be formed on a substrate 110, and portions of the interlayer insulating film 112 may be etched to form a plurality of line-type trenches T1. The plurality of line-type trenches T1 may be formed to extend parallel to each other in a second lateral direction (Y direction). The interlayer insulating film 112 may constitute the insulating structure IL1 shown in FIGS. 2B and 3B.

Thereafter, a plurality of conductive lines 114 may be formed to fill lower portions of the plurality of line-type trenches T1. In example embodiments, to form the plurality of conductive lines 114, a metal-containing conductive layer may be formed on the interlayer insulating film 112 in which the plurality of line-type trenches T1 are formed, and portions of the metal-containing conductive layer may be removed using an etchback process, and thus, the plurality of conductive lines 114 may remain in the plurality of line-type trenches T1. After the plurality of conductive lines 114 are formed, an upper space of each of the plurality of line-type trenches T1 may remain empty.

Figure 12A:
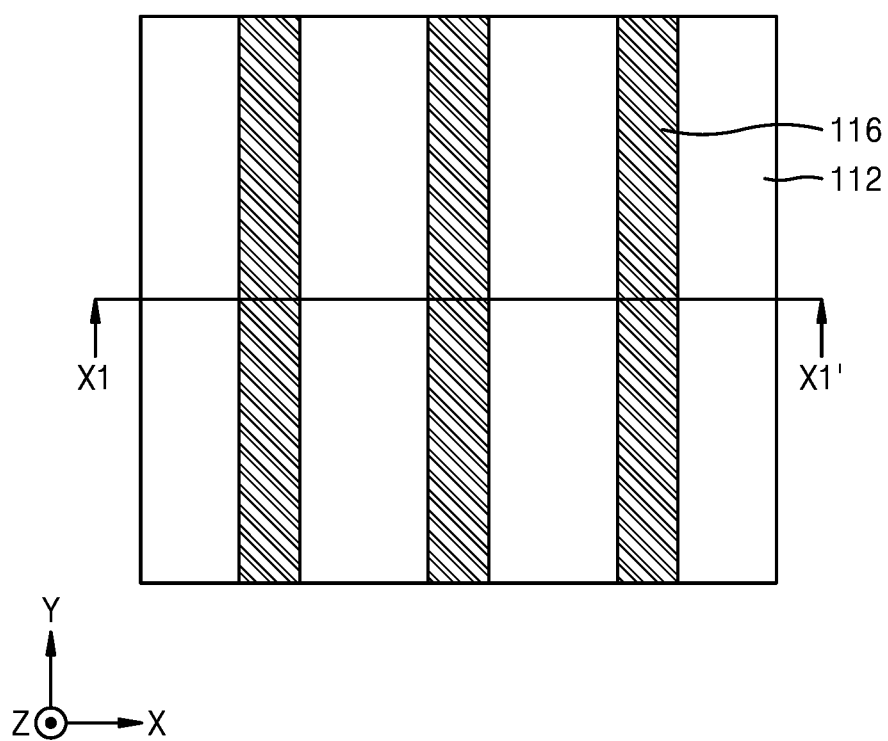
Figure 12B:
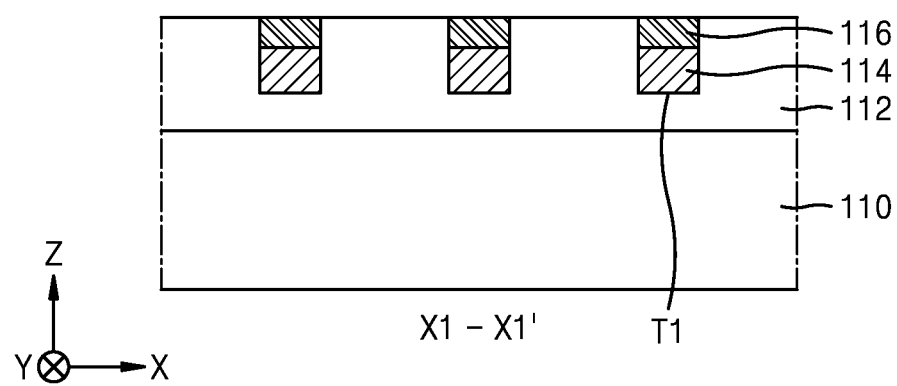

Referring to FIGS. 12A and 12B, a lower impurity region 116 may be formed to fill the upper space of each of the plurality of line-type trenches T1 in the resultant structure of FIGS. 11A and 11B. The lower impurity region 116 may be disposed on each of the plurality of conductive lines 114 in the plurality of line-type trenches T1.

Figure 13A:
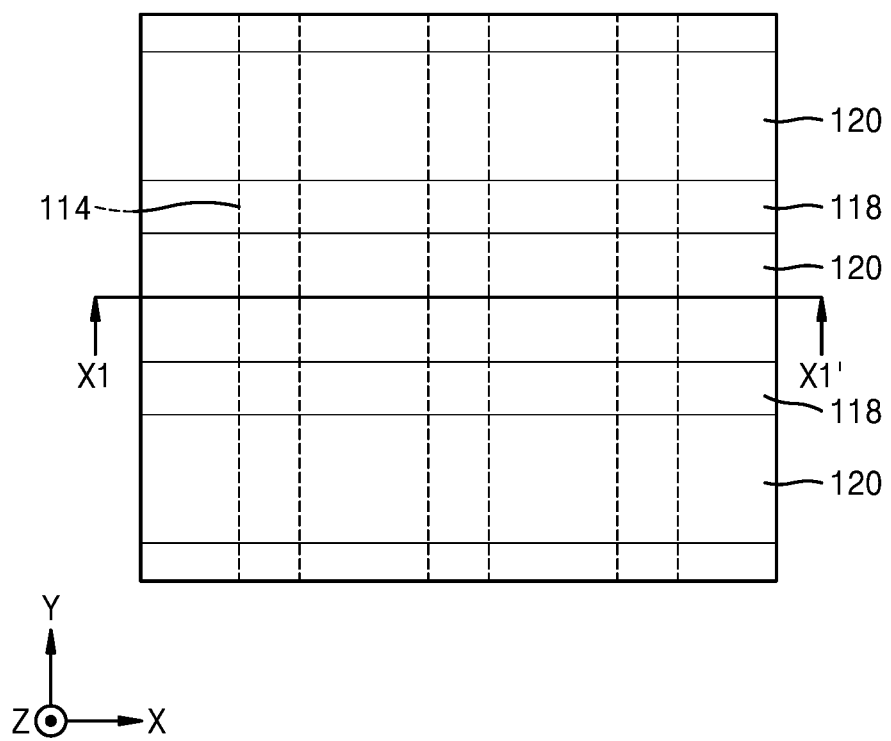
Figure 13B:
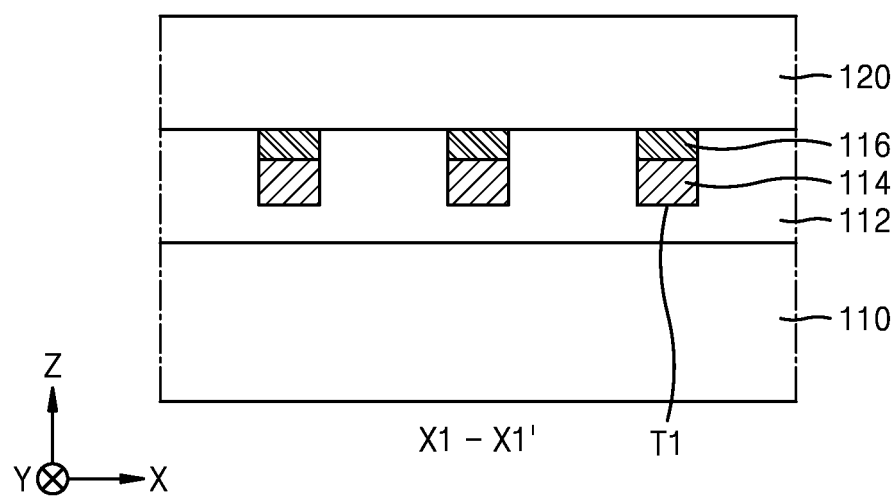

Referring to FIGS. 13A and 13B, an insulating film 118 (refer to FIG. 13A) may be formed to cover the entire surface of the resultant structure of FIGS. 12A and 12B. Partial regions of the insulating film 118 may be etched to form a plurality of line-type spaces, which extend in a first lateral direction (X direction). The plurality of line-type spaces may be filled with a sacrificial film 120. In example embodiments, the insulating film 118 may include a silicon oxide film, and the sacrificial film 120 may include a silicon nitride film. Planar shapes of the plurality of conductive lines 114 are illustrated with dashed lines in FIG. 13A for brevity. The insulating film 118 remaining on the resultant structure of FIG. 13A may constitute a portion of the insulating structure IL2 shown in FIGS. 2B and 3B.

Figure 14A:
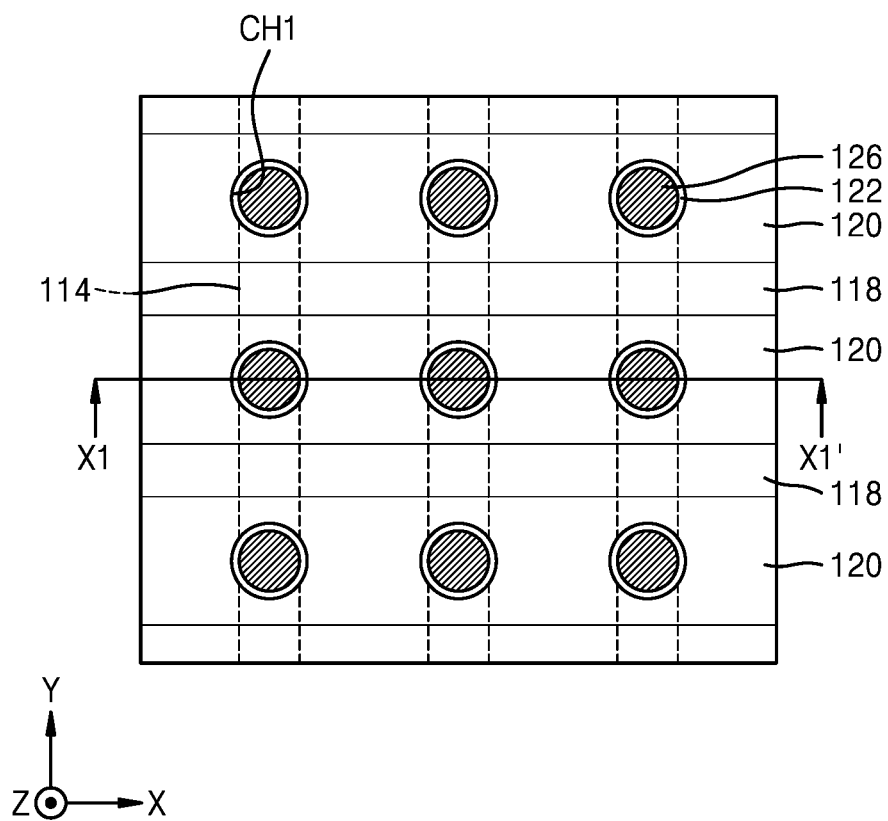
Figure 14B:
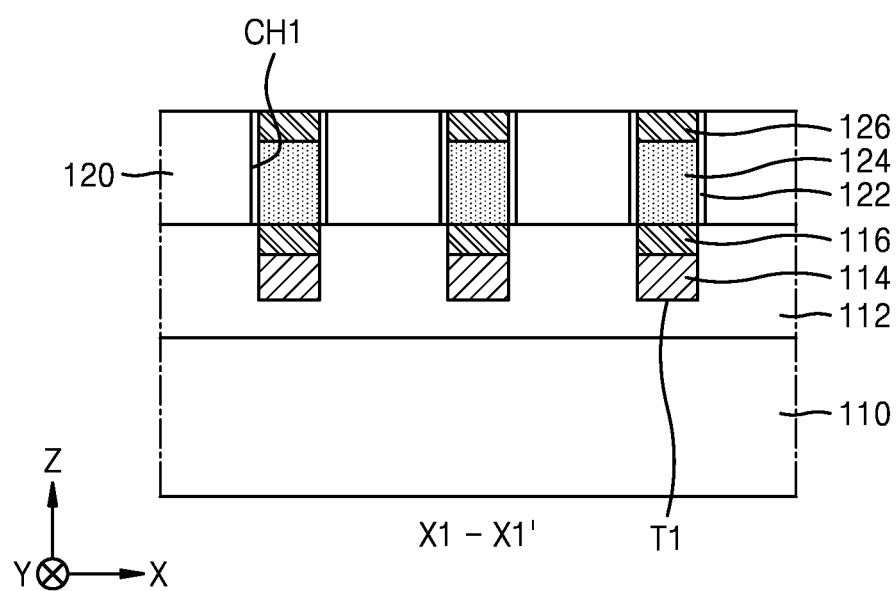

Referring to FIGS. 14A and 14B, partial regions of the sacrificial film 120 may be removed from the resultant structure of FIGS. 13A and 13B, and thus, a plurality of hole spaces CH1 exposing the impurity regions 116 may be formed in the sacrificial film 120. A first gate dielectric film 122 may be formed to cover a sidewall of the sacrificial film 120 inside each of the plurality of hole spaces CH1. A first channel region 124 and an upper impurity region 126 may be sequentially formed in a space defined by the first gate dielectric film 122.

In example embodiments, to form the first channel region 124 and the upper impurity region 126, a polysilicon pattern may be formed to fill spaces defined by the first gate dielectric film 122 in the plurality of hole spaces CH1, and impurity ions may be implanted into an upper partial region of the polysilicon pattern to form the upper impurity region 126. A portion of the polysilicon pattern excluding the upper impurity region 126 may constitute the first channel region 124.

Figure 15:
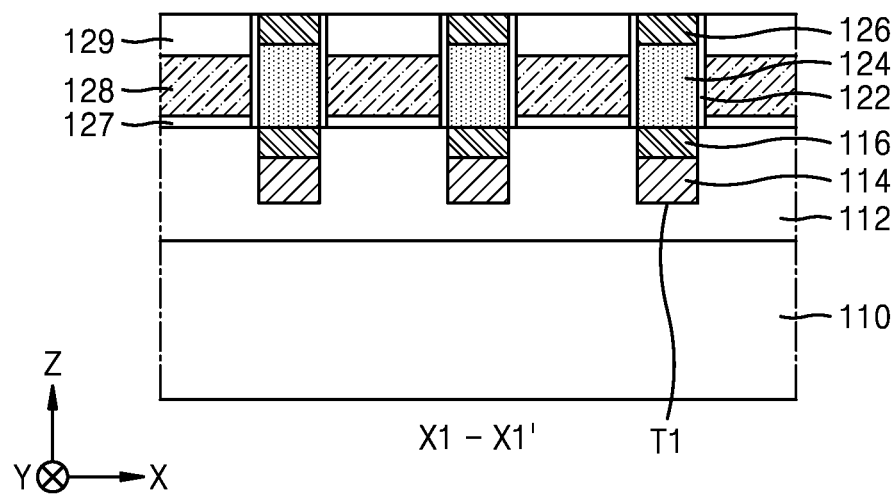

Referring to FIG. 15, portions of the sacrificial film 120 may be removed from the resultant structure of FIGS. 14A and 14B. As a result, a top surface of the interlayer insulating film 112 may be exposed around each of the plurality of first gate dielectric films 122 in the plurality of line-type spaces described with reference to FIGS. 13A and 13B.

Thereafter, a lower insulating film 127, a conductive line 128, and an upper insulating film 129 may be sequentially formed in empty spaces (e.g., the portions removed from the sacrificial film 120) of the plurality of line-type spaces. In example embodiments, each of the lower insulating film 127 and the upper insulating film 129 may include an oxide film. The lower insulating film 127 and the upper insulating film 129 may constitute a portion of the insulating structure IL2 shown in FIGS. 2B and 3B. In example embodiments, the lower insulating film 127 may be omitted. In this case, a bottom surface of the conductive line 128 may be in contact with the top surface of the interlayer insulating film 112.

Figure 16:
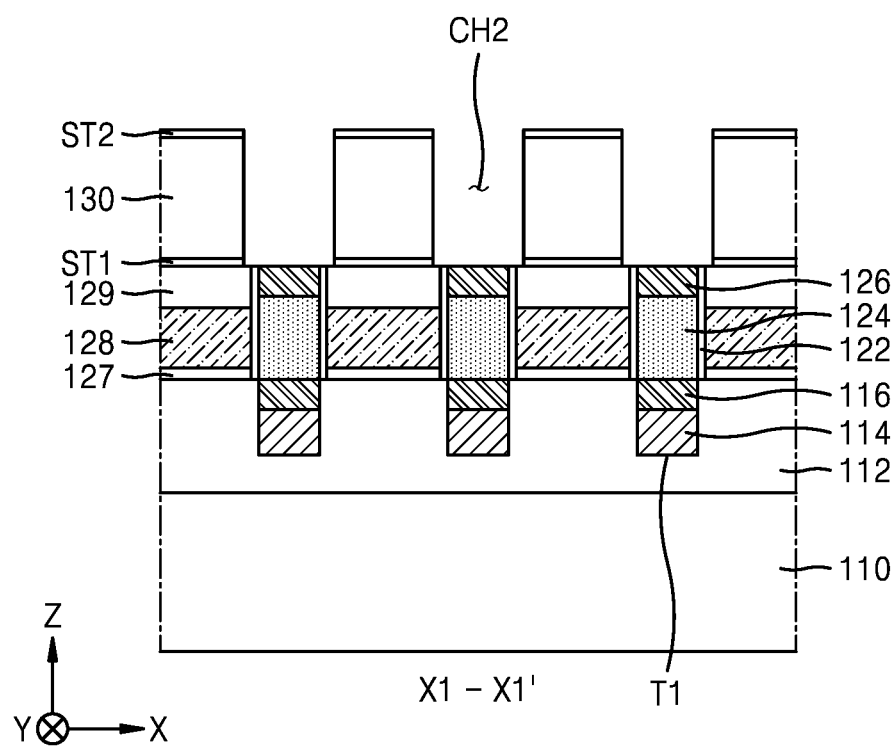

Referring to FIG. 16, in the resultant structure of FIG. 15, an insulating stack structure including a first etch stop film ST1, an interlayer insulating film 130, and a second etch stop film ST2 may be sequentially disposed on a top surface of each of the upper insulating film 129 and the insulating film 118 (refer to FIG. 13A). Partial regions of the insulating stack structure may be removed, and thus, a plurality of hole spaces CH2 may be formed in the insulating stack structure. In example embodiments, each of the first etch stop film ST1 and the second etch stop film ST2 may include a silicon nitride film or an aluminum oxide film, and the interlayer insulating film 130 may include a silicon oxide film.

After the plurality of hole spaces CH2 are formed, the first etch stop film ST1, the interlayer insulating film 130, and the second etch stop film ST2, which remain on the substrate 110, may constitute the insulating structure IL3 shown in FIGS. 2B and 3B. In example embodiments, the first etch stop film ST1 and the second etch stop film ST2 may be omitted.

Figure 17:
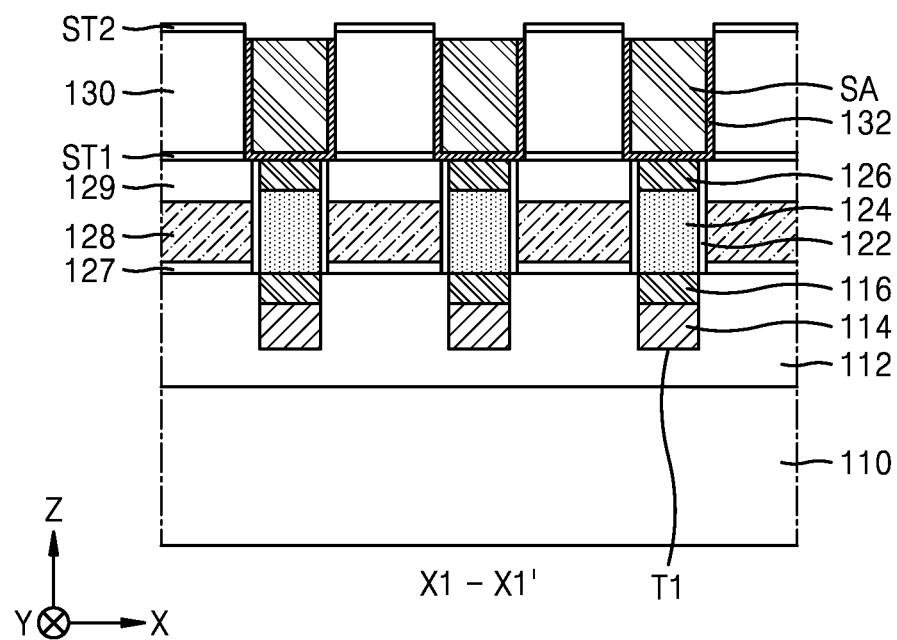

Referring to FIG. 17, in the resultant structure of FIG. 16, a lower-electrode forming conductive layer may be formed to conformally cover inner surfaces of the plurality of hole spaces CH2 and a top surface of the second etch stop film ST2. A sacrificial film SA may be formed on the lower-electrode forming conductive layer to fill the inside of each of the plurality of hole spaces CH2. Each of the lower-electrode 132 forming conductive layer and the sacrificial film SA may be etched back such that top surfaces of each of the lower-electrode forming conductive layer and the sacrificial film SA are at a lower level than the top surface of the second etch stop film ST2. As a result, the lower-electrode forming conductive layer may be chamfered, and thus, a plurality of lower electrodes 132 may be formed from the lower-electrode forming conductive layer. Inner surfaces of the plurality of lower electrodes 132 may be covered by the sacrificial film SA.

Figure 18:
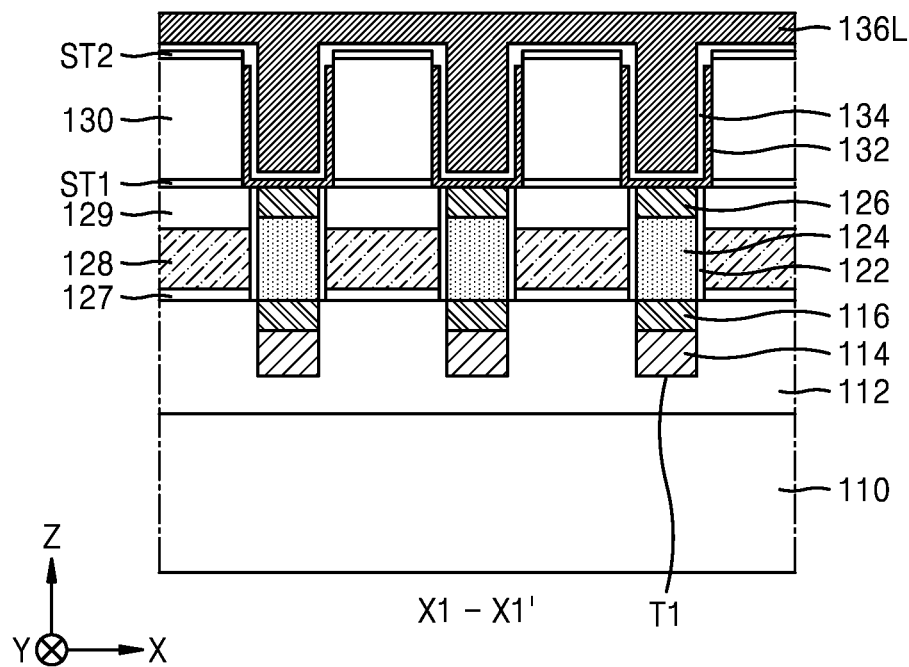

Referring to FIG. 18, a ferroelectric film 134 may be formed on the resultant structure of FIG. 17, and an upper-electrode forming conductive layer 136L may be formed on the ferroelectric film 134. A constituent material of the upper-electrode forming conductive layer 136L may be the same as that of the upper electrode 136, which has been described with reference to FIG. 2B.

Figure 19:
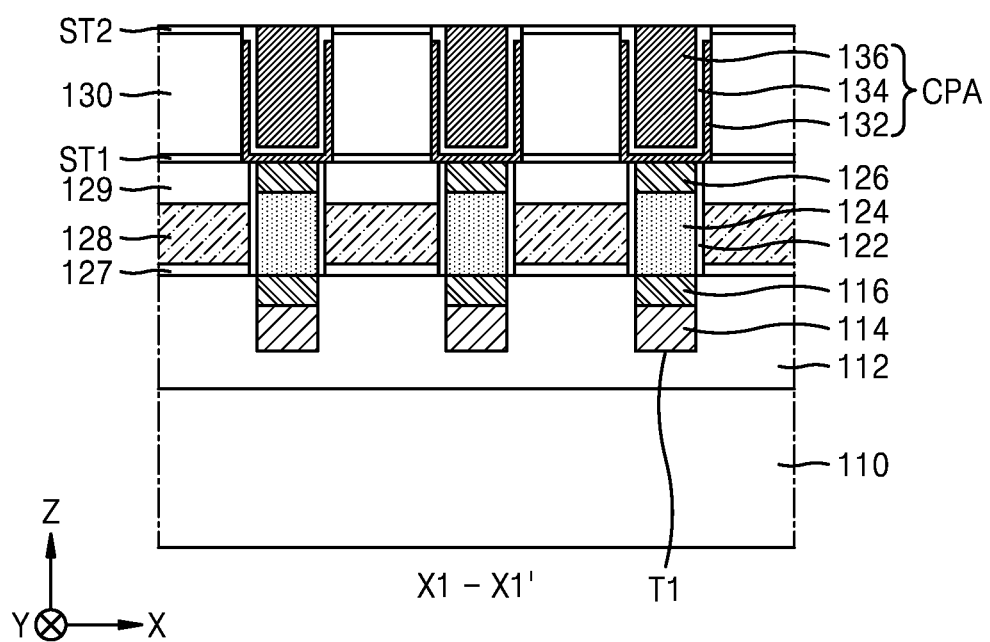

Referring to FIG. 19, in the resultant structure of FIG. 18, portions of the upper-electrode forming conductive layer 136L and the ferroelectric film 134 may be respectively removed from top surfaces thereof, and thus, a plurality of upper electrodes 136 having planarized top surfaces may be formed, and the top surface of the second etch stop film ST2 may be exposed. As a result, a plurality of lower capacitors CPA may be formed to fill the plurality of hole spaces CH2, respectively.

Figure 20:
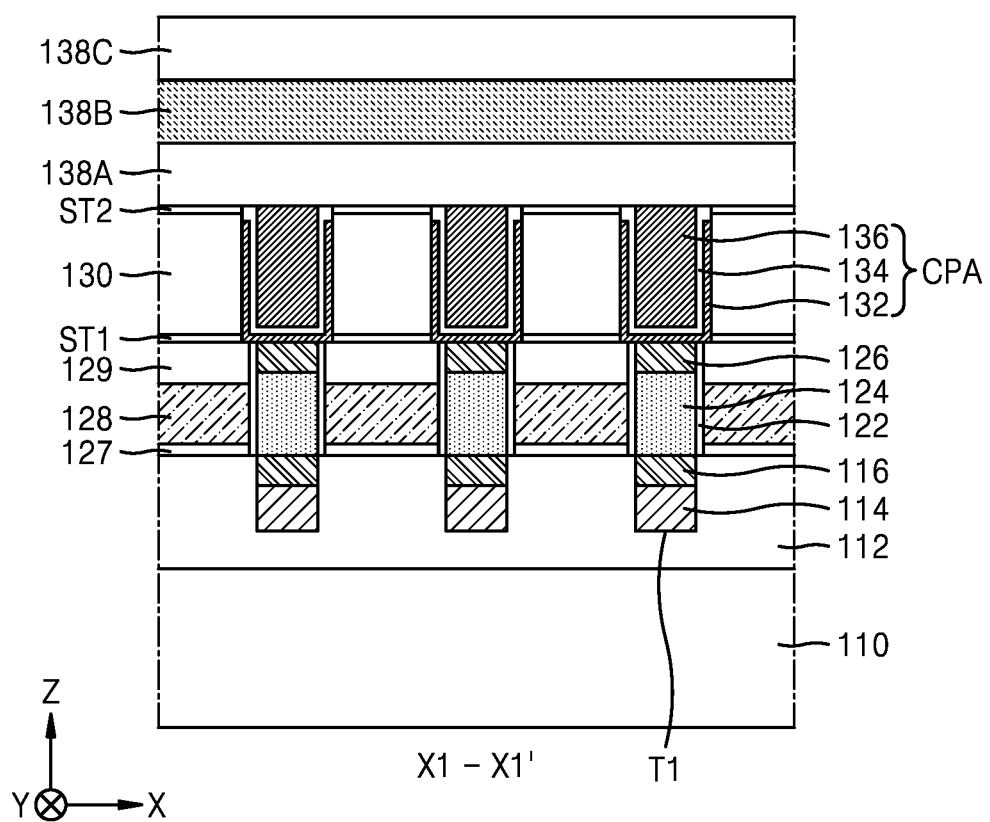

Referring to FIG. 20, in the resultant structure of FIG. 19, a first insulating film 138A, a second insulating film 138B, and a third insulating film 138C may be sequentially formed on top surfaces of the plurality of lower capacitors CPA and the second etch stop film ST2. In example embodiments, the first insulating film 138A and the third insulating film 138C may include a silicon oxide film, and the second insulating film 138B may include a silicon nitride film.

Figure 21A:
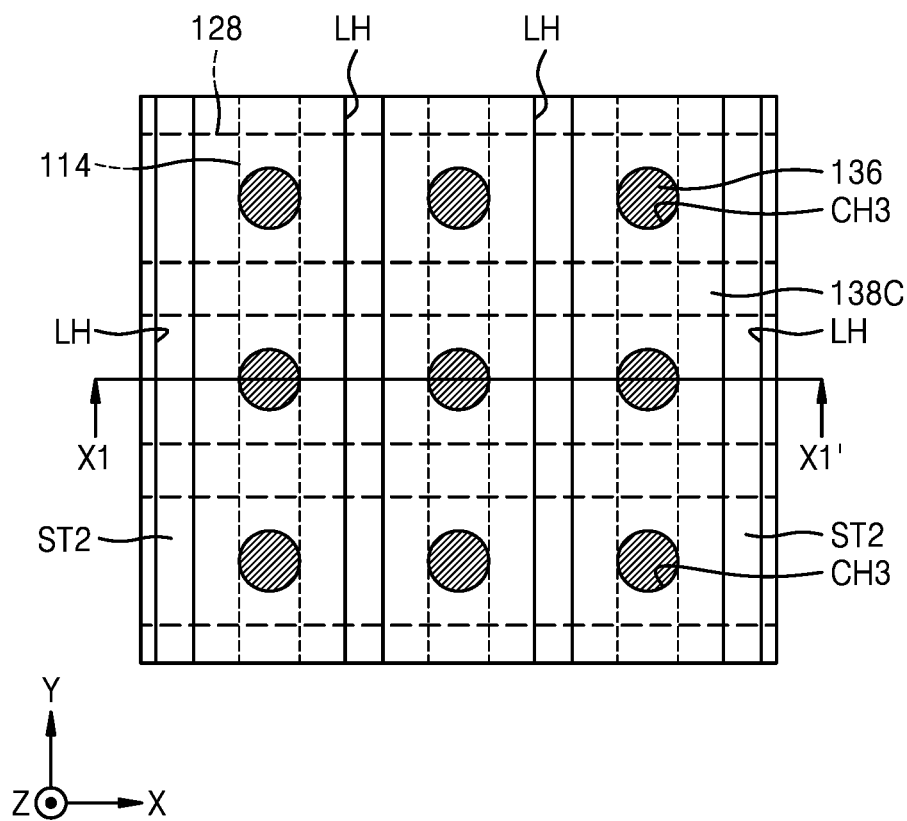
Figure 21B:
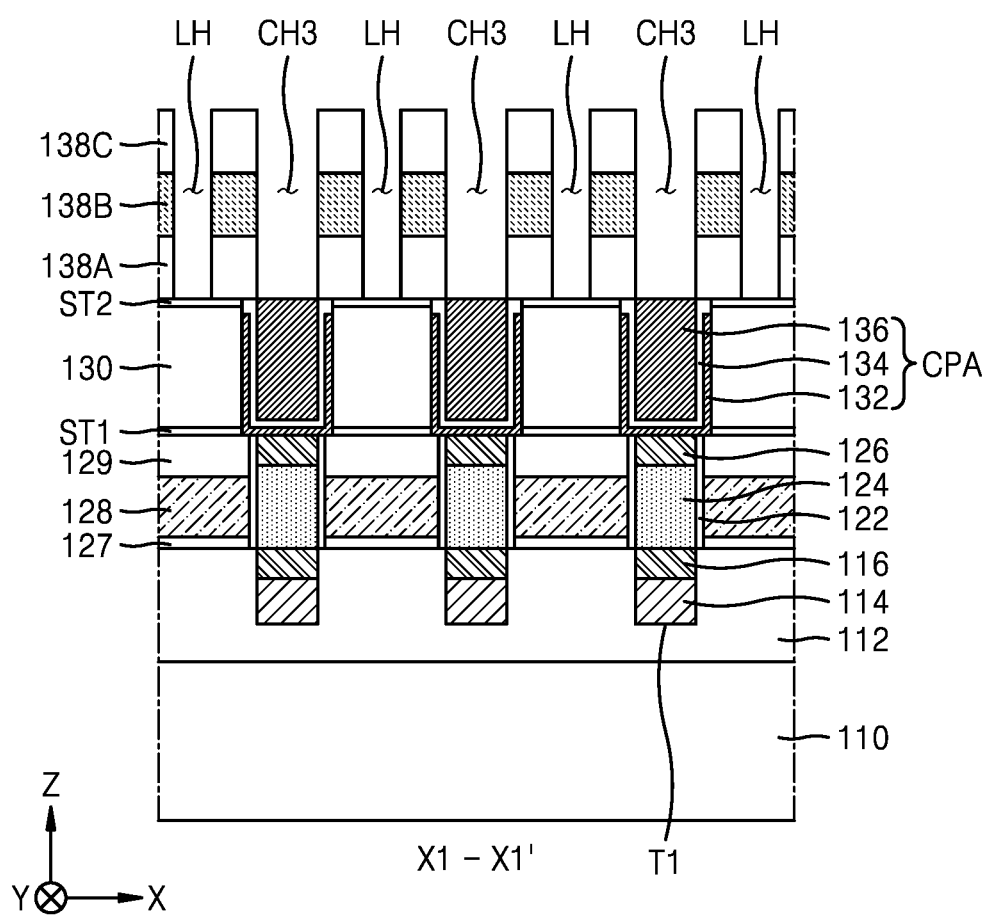

Referring to FIGS. 21A and 21B, partial regions of each of the first insulating film 138A, the second insulating film 138B, and the third insulating film 138C may be removed from the resultant structure of FIG. 20, and thus, a plurality of line spaces LH exposing the top surface of the second etch stop film ST2 and a plurality of hole spaces CH3 exposing the upper electrode 136 of the lower capacitor CPA may be formed. Each of the plurality of line spaces LH may extend long in the second lateral direction (Y direction). A plurality of hole spaces CH3 may be arranged in a line in the second lateral direction (Y direction) between two adjacent ones of the plurality of line spaces LH.

Figure 22:
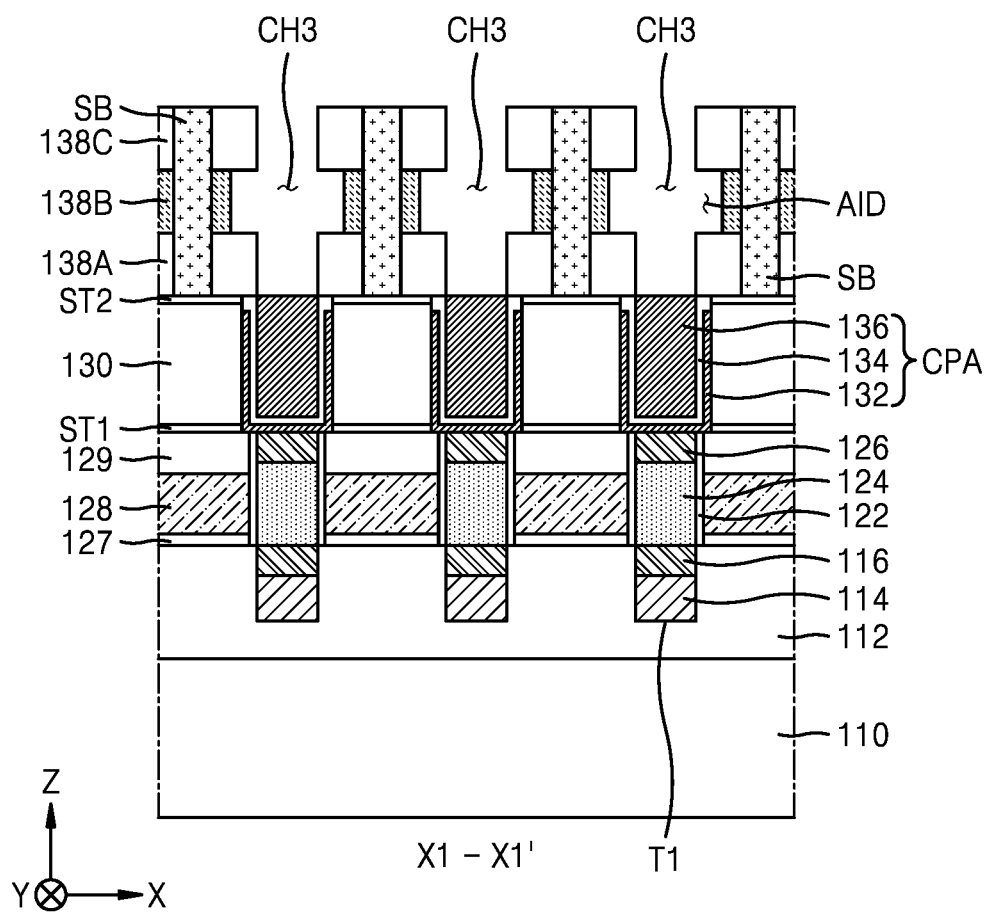

Referring to FIG. 22, in the resultant structure of FIGS. 21A and 21B, the plurality of line spaces LH may be filled with a sacrificial film SB, and portions of the second insulating film 138B, which are exposed through the plurality of hole spaces CH3, may be selectively etched, and thus, a plurality of annular indent spaces AID may be formed. A height of the plurality of annular indent spaces AID in a vertical direction (Z direction) may be formed between an upper surface of the first insulating film 138A and a lower surface of the third insulating film 138C. Each of the plurality of annular indent spaces AID may be connected to the hole space CH3.

Figure 23A:
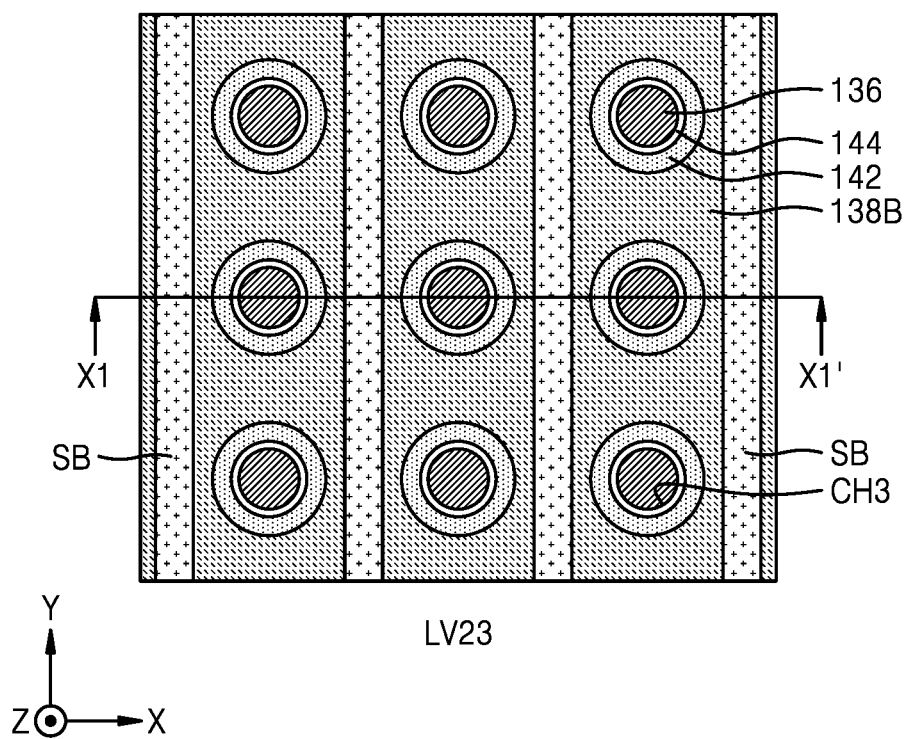
Figure 23B:
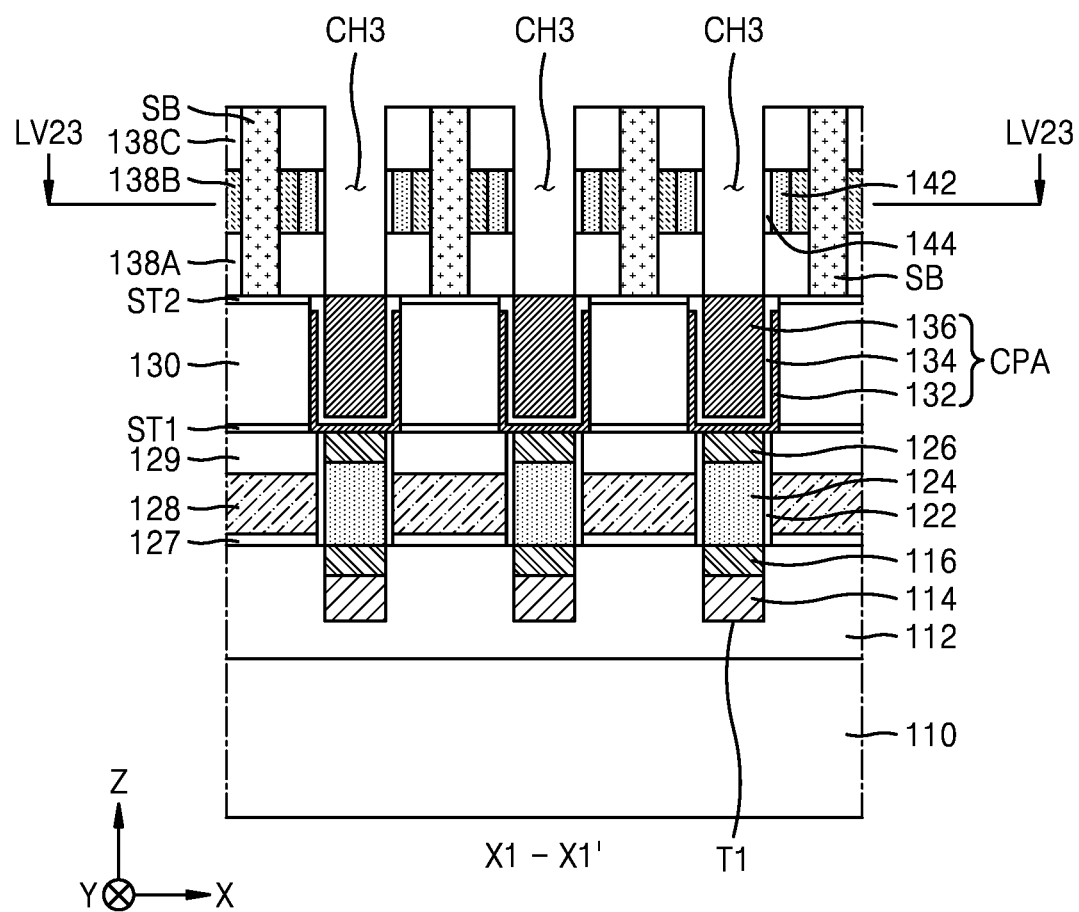

Referring to FIGS. 23A and 23B, in the resultant structure of FIG. 22, a second channel region 142 and a second gate dielectric film 144 may be formed in each of the plurality of annular indent spaces AID through the plurality of hole spaces CH3. FIG. 23A illustrates a planar configuration along a vertical level LV23 of FIG. 23B.

More specifically, to form the plurality of second channel regions 142, a material layer for forming the second channel region 142 may be formed to fill each of the plurality of annular indent spaces AID in the resultant structure of FIG. 22. Next, portions of the material layer may be removed using an etching process to leave only a portion of the material layer, which covers a surface of the second insulating film 138 exposed in each of the plurality of annular indent spaces AID. Thereafter, a process similar to the process of forming the plurality of second channel regions 142 may be performed, and thus, a second gate dielectric film 144 may be formed to fill a space remaining next to the second channel region in each of the plurality of annular indent spaces AID.

After the second channel region 142 and the second gate dielectric film 144 are formed in each of the plurality of annular indent spaces AID, the upper electrode 136 of the lower capacitor CPA may be exposed at the bottom of each of the plurality of hole spaces CH3.

Figure 24A:
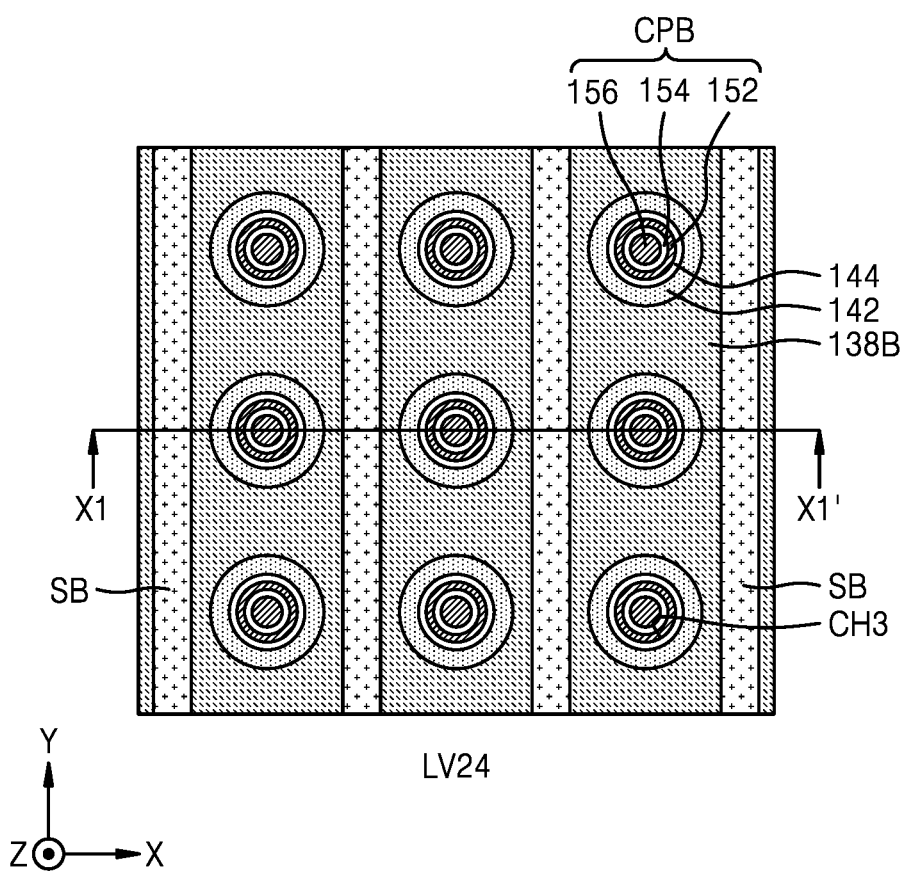
Figure 24B:
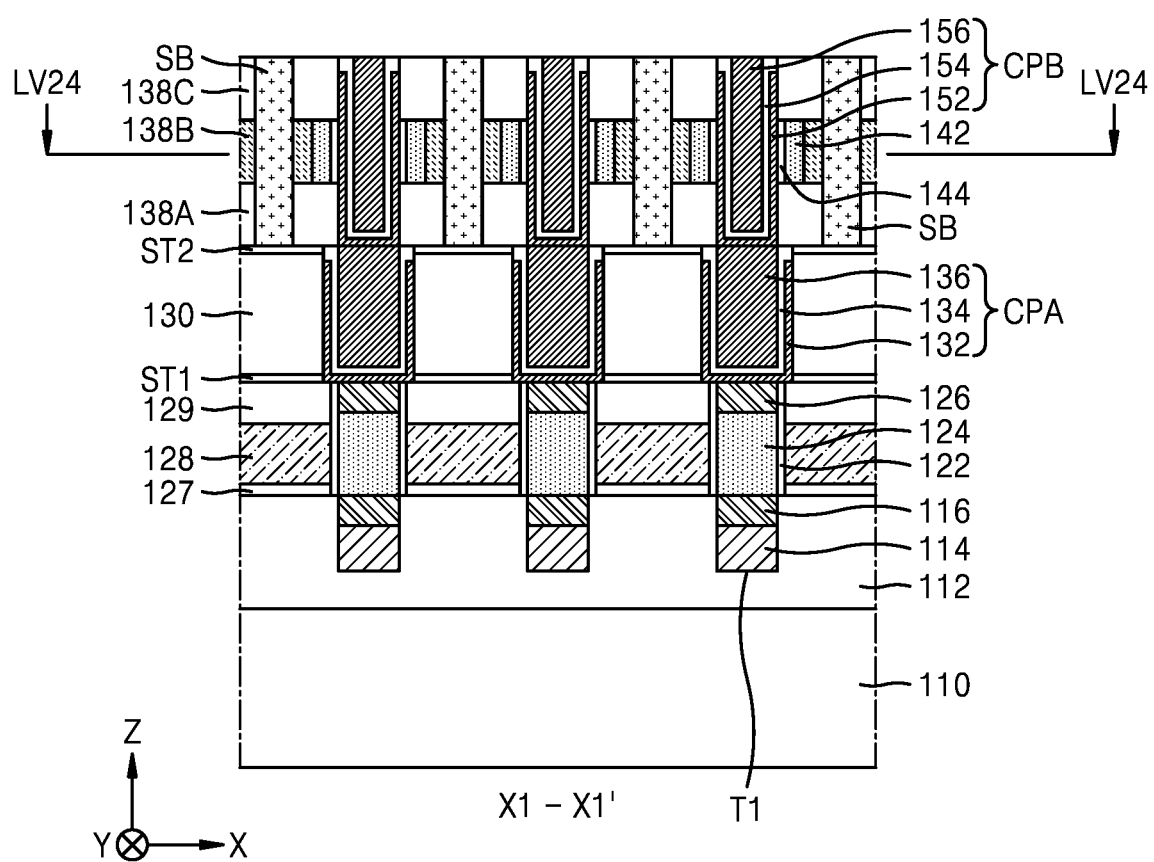

Referring to FIGS. 24A and 24B, a plurality of upper capacitors CPB may be formed in the plurality of hole spaces CH3 in the resultant structure of FIGS. 23A and 23B. FIG. 24A illustrates a planar configuration along a vertical level LV24 of FIG. 24B.

In example embodiments, to form the plurality of upper capacitors CPB, a process similar to the process of forming the plurality of lower capacitors CPA, which has been described with reference to FIGS. 17 to 19, may be performed.

Figure 25A:
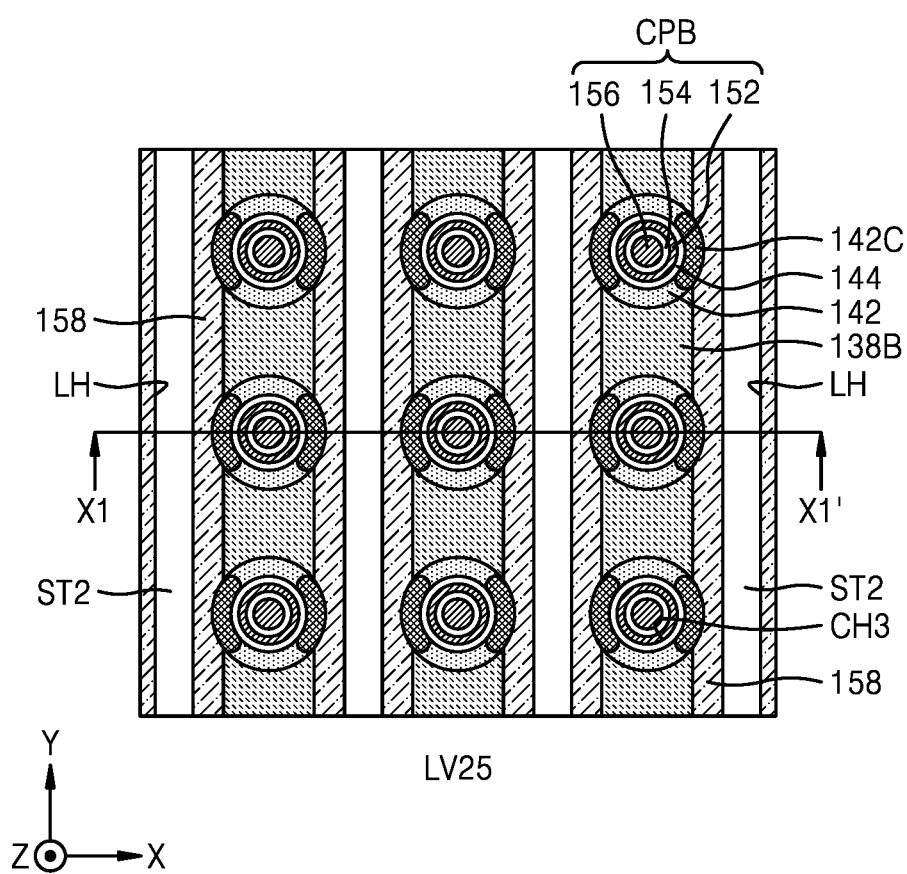
Figure 25B:
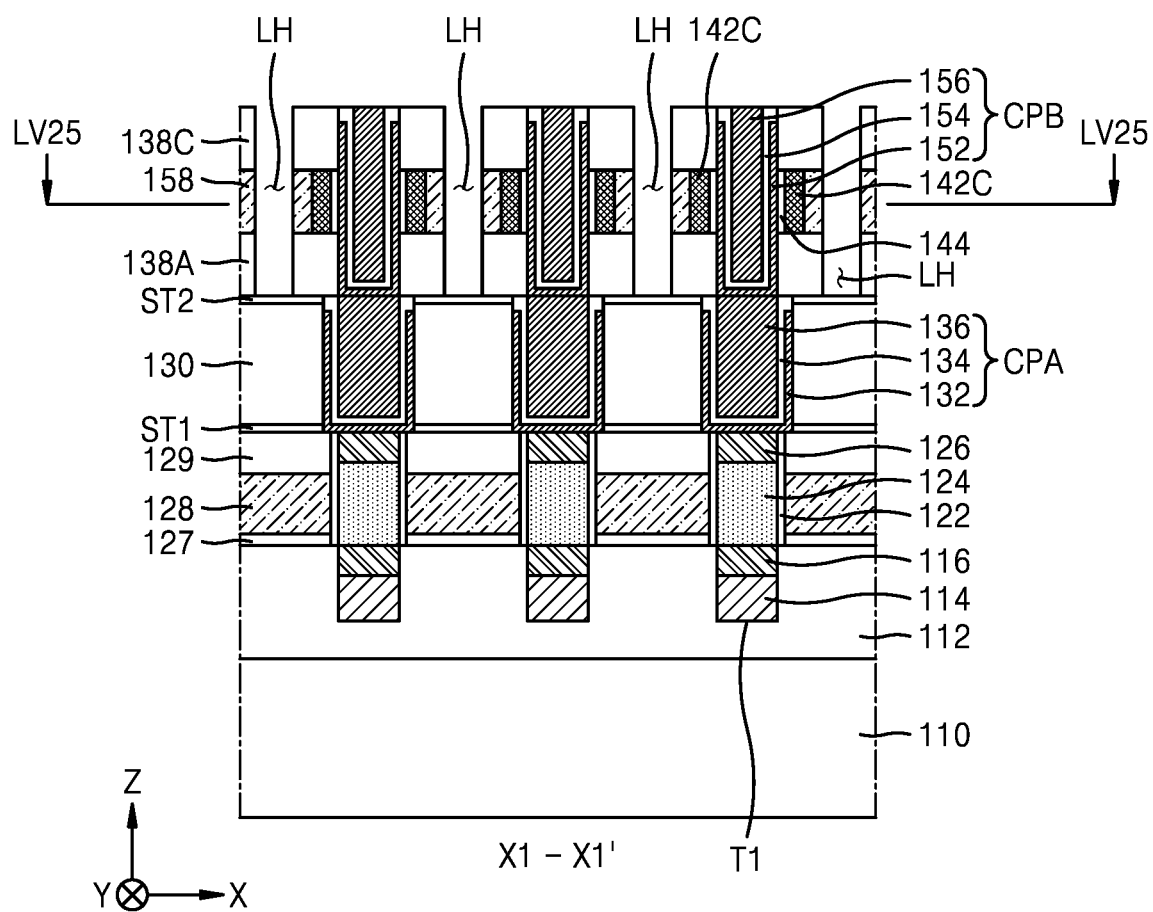

Referring to FIGS. 25A and 25B, the sacrificial film SB filling the plurality of line spaces LH may be removed from the resultant structure of FIGS. 24A and 24B, and portions of the second insulating film 138B exposed through the plurality of line spaces LH may be removed. As a result, a plurality of indent line spaces, which are connected to the plurality of line spaces LH, may be obtained. The remaining portions of the plurality of second channel regions 142 and the second insulating film 138B may be exposed through the plurality of indent line spaces.

Afterwards, an ohmic contact portion 142C may be formed in partial regions of the channel region 142, which are exposed through the plurality of indent line spaces. By forming the ohmic contact portion 142C in the partial regions of the second channel region 142 and performing the processes described below, the semiconductor memory device 100A described with reference to FIGS. 3A and 3B may be manufactured.

In other example embodiments, when the process of forming the ohmic contact portion 142C in the second channel region 142 is omitted and the processes described below are performed, the semiconductor memory device 100 described with reference to FIGS. 2A to 2D may be manufactured.

Thereafter, a plurality of conductive lines 158 may be formed to fill the plurality of indent line spaces, which are obtained by removing the portions of the second insulating film 138B as described above. In example embodiments, to form the plurality of conductive lines 158, a conductive film may be formed to such a sufficient thickness so as to fill the plurality of indent line spaces on the resultant structure from which the portions of the second insulating film 138B are removed. Thereafter, portions of the conductive film may be removed to leave only portions of the conductive film, which fill the plurality of indent line spaces. After the plurality of conductive lines 158 are formed, the second etch stop film ST2 may be exposed at the bottom of each of the plurality of line spaces LH, and the plurality of conductive lines 158 may be respectively exposed at sidewalls of the plurality of line spaces LH. FIG. 25A illustrates a planar configuration along a vertical level LV25 of FIG. 25B.

Figure 26:
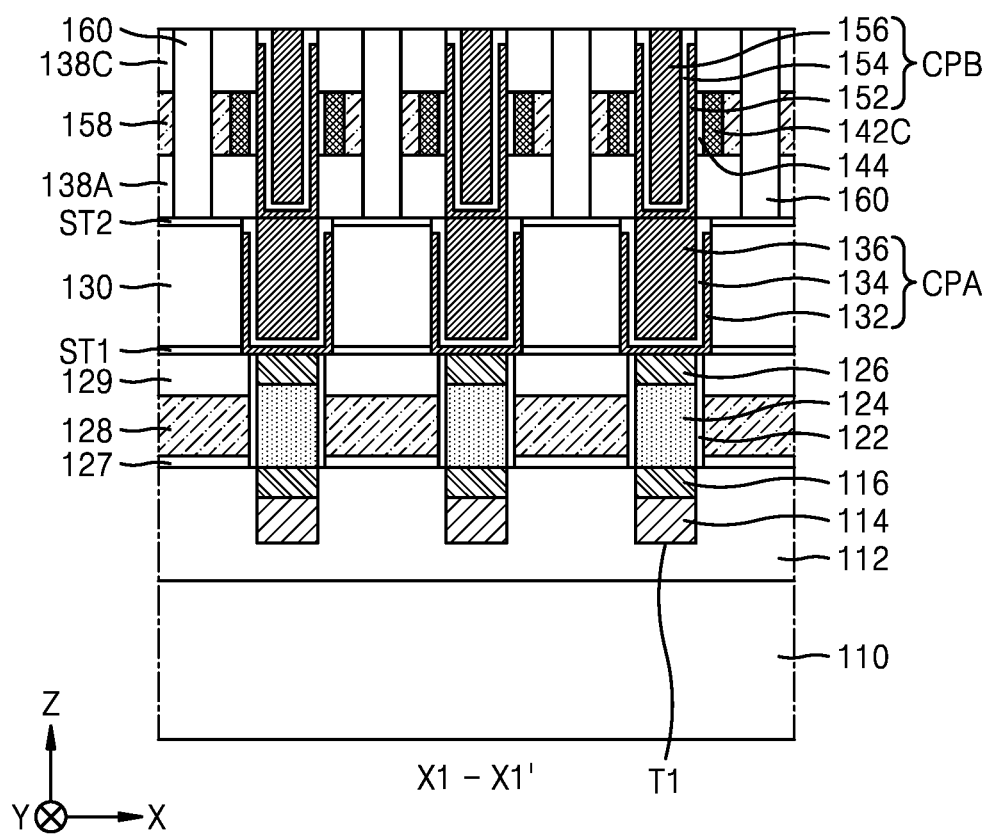

Referring to FIG. 26, insulating patterns 160 may be respectively formed to fill the plurality of line spaces LH in the resultant structure of FIGS. 25A and 25B.

The first insulating film 138A, the second insulating film 138B (refer to FIG. 25A), the third insulating film 138C, and the insulating pattern 160, which remain in the resultant structure of FIG. 26, may constitute the insulating structure IL4 shown in FIGS. 2B and 3B.

Figure 27:
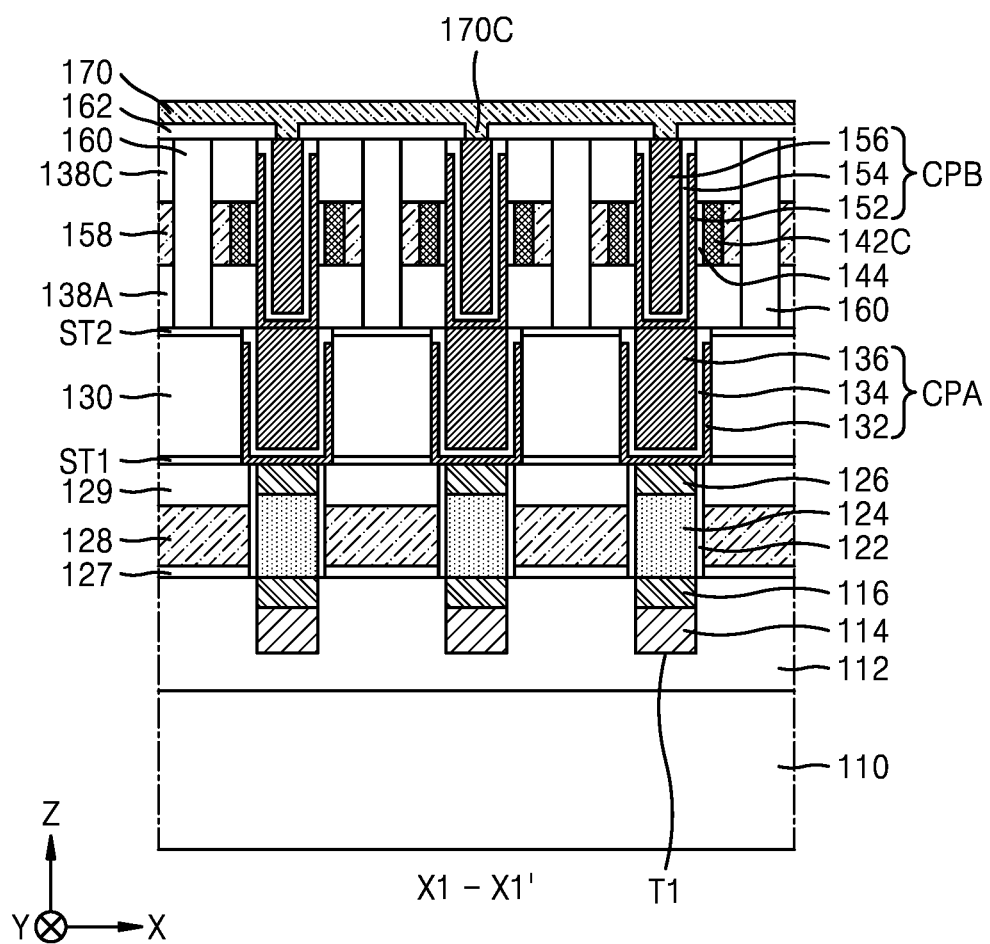

Referring to FIG. 27, an upper insulating film 162 may be formed on the resultant structure of FIG. 26, and partial regions of the upper insulating film 162 may be removed to expose an upper electrode 156 of each of the plurality of upper capacitors CPB.

Thereafter, a plurality of upper conductive lines 170 may be formed on the upper insulating film 162. As shown in FIG. 2A, each of the plurality of upper conductive lines 170 may be connected to the upper electrode 156 of each of the plurality of upper capacitors CPB arranged in the first lateral direction (X direction), from among the plurality of upper capacitors CPB.

FIGS. 28 to 31 are cross-sectional views illustrating a method of manufacturing a semiconductor memory device, according to example embodiments. FIGS. 28 to 31 illustrate cross-sectional configurations of portions corresponding to a cross-section taken along the line X1-X1' of FIG. 2A, according to a process sequence. A method of manufacturing the semiconductor memory device 400 shown in FIG. 6, according to an example embodiment, will be described with reference to FIGS. 28 to 31.

Figure 28:
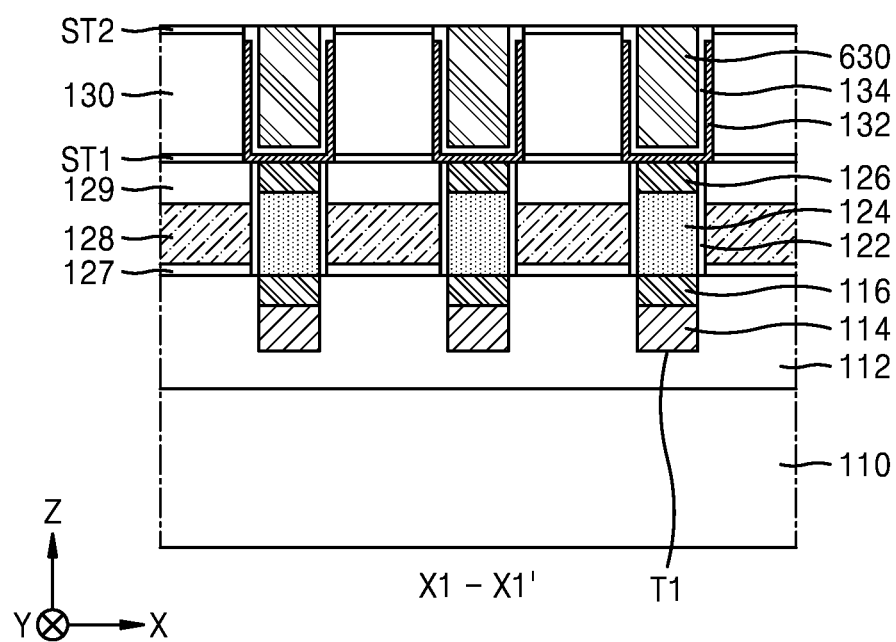
FIGS. 28 to 31 are cross-sectional views of a process sequence of a method of manufacturing a semiconductor memory device, according to example embodiments.

Referring to FIG. 28, processes similar to those described with reference to FIGS. 11A to 19 may be performed. However, in the present example embodiment, a plurality of sacrificial patterns 630 may be formed instead of the plurality of upper electrodes 136 shown in FIG. 19. The plurality of sacrificial patterns 630 may include polysilicon or a silicon nitride film.

Figure 29:
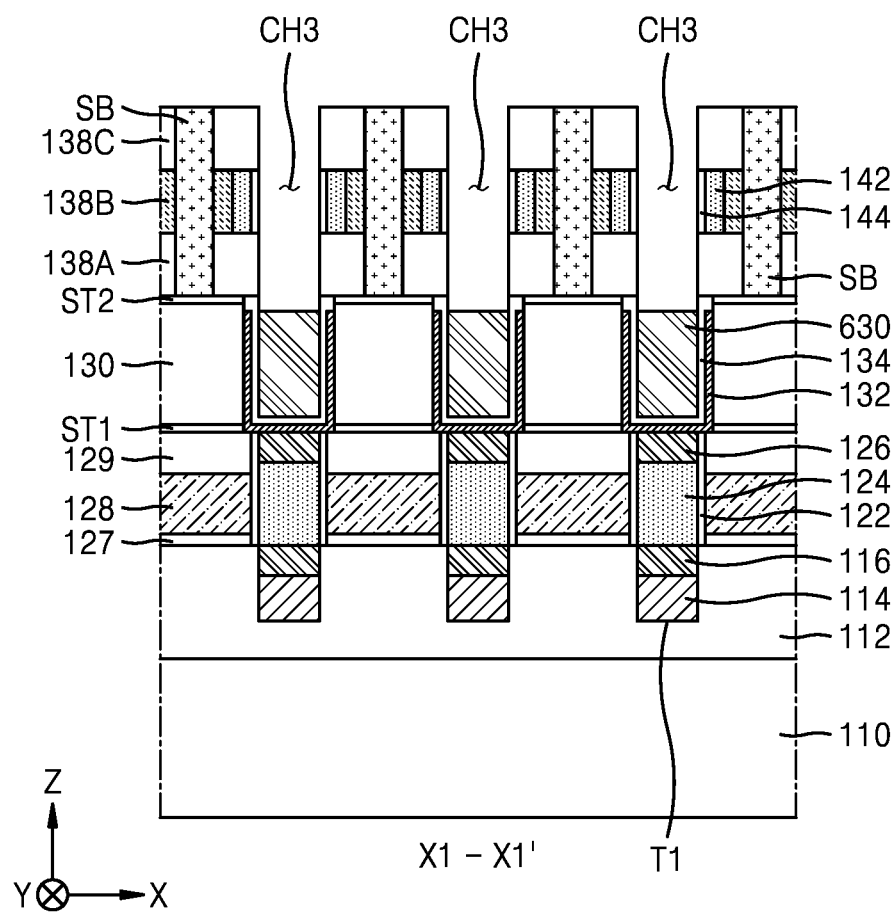

Referring to FIG. 29, the processes described with reference to FIGS. 20 to 23B may be performed on the resultant structure of FIG. 28. In this case, when a second insulating film 138B and a plurality of sacrificial patterns 630 include the same material or similar materials, while portions of the second insulating film 138B, which are exposed through a plurality of hole spaces CH3, are selectively etched as described with reference to FIG. 22, upper portions of the plurality of sacrificial patterns 630 may be consumed, and thus, a height of a top surface of each of the plurality of sacrificial patterns 630 may be reduced.

Figure 30:
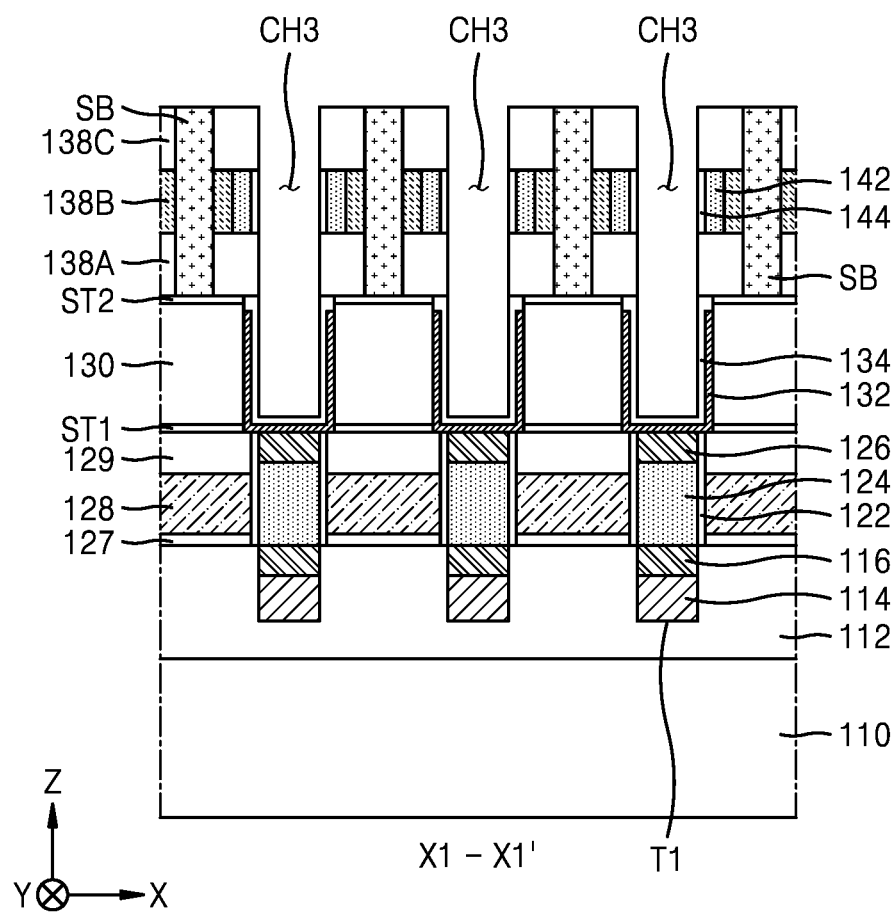

Referring to FIG. 30, the plurality of sacrificial patterns 630 exposed through the plurality of hole spaces CH3 may be removed. As a result, a length of the plurality of hole spaces CH3 in a vertical direction (Z direction) may be increased, and a ferroelectric film 134 of each of a plurality of lower capacitors CPA may be exposed through the plurality of hole spaces CH3.

Figure 31:
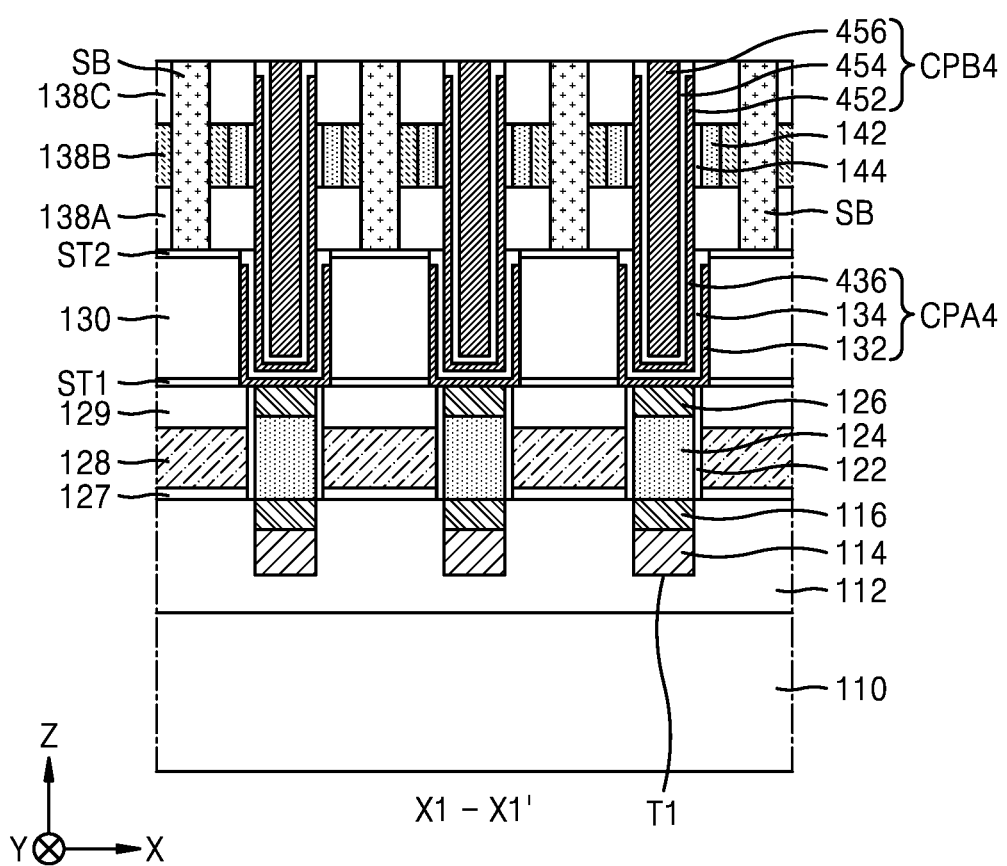

Referring to FIG. 31, in the resultant structure of FIG. 30, a lower electrode 452, a dielectric film 454, and an upper electrode 456 may be sequentially formed inside each of the plurality of hole spaces CH3 to form a plurality of upper capacitors CPB4. In example embodiments, to form the plurality of upper capacitors CPB4, a process similar to the process of forming the plurality of lower capacitors CPA, which has been described with reference to FIGS. 17 to 19, may be performed.

Afterwards, the processes described with reference to FIGS. 25A to 27 may be performed, and thus, the semiconductor memory device 400 shown in FIG. 6 may be manufactured.

Although the method of manufacturing the semiconductor memory device 100 shown in FIGS. 2A to 2D and the method of manufacturing the semiconductor memory device 100A shown in FIGS. 3A and 3B have been described with reference to FIGS. 11A to 27, it will be understood that the semiconductor memory device 10 shown in FIGS. 1A and 1B, the semiconductor memory devices 300A, 300B, 300C, 300D, 500, 600, 700, and 800 shown in FIGS. 4A to 10, and semiconductor memory devices having various other structures may be manufactured by making various modifications and changes within the scope of the inventive concept of the disclosure.

While the inventive concept has been particularly shown and described with reference to embodiments thereof, it will be understood that various changes in form and details may be made therein without departing from the spirit and scope of the following claims.

What is claimed is:
1. A semiconductor memory device comprising:
a substrate;
a transistor disposed above the substrate, the transistor having a channel region defining an inner space; and
a capacitor passing through the transistor in a vertical direction in the inner space.
2. The semiconductor memory device of claim 1, wherein the capacitor comprises:
a first electrode having a cylindrical shape and extending through the inner space in the vertical direction;
a dielectric film disposed on an inner surface of the first electrode;
a second electrode disposed on the dielectric film and surrounded by the first electrode.
3. The semiconductor memory device of claim 1, wherein the transistor comprises:
a gate dielectric film between an inner surface of the channel region and the capacitor; and
a conductive line disposed on the capacitor and extending in a first lateral direction on an opposite side of the substrate with the channel region and the capacitor therebetween, the conductive line configured to be connected to the gate dielectric film through the capacitor.
4. The semiconductor memory device of claim 1, further comprising:
a first conductive line configured to be connected to a first portion of the channel region; and
a second conductive line configured to be connected to a second portion of the channel region,
wherein the first conductive line and the second conductive line are spaced apart from each other with the capacitor therebetween in a first lateral direction.

5. The semiconductor memory device of claim 4, wherein the channel region comprises a doped polysilicon, and
wherein each of the first portion and the second portion of the channel region has a higher dopant concentration than other portion of the channel region.
6. The semiconductor memory device of claim 1, further comprising a ferroelectric capacitor between the substrate and the capacitor,
wherein the capacitor comprises:
a first electrode having a cylindrical shape and extending in the vertical direction through the inner space, the first electrode having a first bottom surface configured to be connected to the ferroelectric capacitor;
a dielectric film disposed on an inner surface of the first electrode; and
a second electrode disposed on an inner surface of the dielectric film and surrounded by the first electrode, and
wherein the ferroelectric capacitor comprises:
a third electrode between the substrate and the capacitor, the third electrode having the cylindrical shape to define a pillar-type space;
a ferroelectric film disposed on an inner surface of the third electrode in the pillar-type space; and
a fourth electrode disposed on an inner surface the ferroelectric film in the pillar-type space and surrounded by the third electrode.
7. The semiconductor memory device of claim 6, wherein a lowermost surface of the first electrode is outside the pillar-type space, and
wherein the fourth electrode has a pillar shape filling the pillar-type space on the ferroelectric film.
8. The semiconductor memory device of claim 6, further comprising a contact plug between the capacitor and the ferroelectric capacitor, the contact plug having a top surface in contact with the first electrode and a bottom surface in contact with the fourth electrode.
9. The semiconductor memory device of claim 6, wherein the capacitor comprises:
a first local portion passing through the inner space defined by the channel region; and
a second local portion inserted into the pillar-type space defined by the third electrode,
wherein each of the first electrode, the dielectric film, and the second electrode is included in the first local portion and the second local portion.
10. The semiconductor memory device of claim 6, further comprising a lower transistor between the substrate and the ferroelectric capacitor,
wherein the third electrode of the ferroelectric capacitor is configured to be connected to the lower transistor.
11. A semiconductor memory device comprising:
a first transistor on a substrate, the first transistor comprising a first channel region at a first vertical level above the substrate and a first gate facing the first channel region;
a second transistor at a second vertical level above the substrate, the second transistor comprising a second channel region defining an inner space and a second gate at a third vertical level, wherein the second vertical level is different from the first vertical level, and the third vertical level is different from the first vertical level and the second vertical level; and
a capacitor passing through the second transistor in a vertical direction in the inner space, wherein the capacitor comprises a first electrode configured to be connected to the first transistor, a second electrode configured to be connected to the second transistor, and a dielectric film between the first electrode and the second electrode.

12. The semiconductor memory device of claim 11, wherein each of the first electrode, the second electrode, and the dielectric film of the capacitor comprises a portion passing through the second transistor in the vertical direction in the inner space.

13. The semiconductor memory device of claim 11, wherein the first transistor further comprises a first gate dielectric film between the first channel region and the first gate, a lower impurity region connected to a lower end portion of the first channel region, and an upper impurity region connected to an upper end portion of the first channel region, and
wherein the first electrode of the capacitor is configured to be connected to the upper impurity region of the first transistor.

14. The semiconductor memory device of claim 11, wherein the second transistor further comprises:
a second gate dielectric film between the second channel region and the capacitor;
a first conductive line configured to be connected to a first portion of the second channel region; and
a second conductive line configured to be connected to a second portion of the second channel region,
wherein the first conductive line and the second conductive line are spaced apart from each other with the capacitor therebetween in a first lateral direction, and
wherein the second gate dielectric film is configured to be connected to the second gate through the capacitor.

15. The semiconductor memory device of claim 11, further comprising a third conductive line between the substrate and the first transistor,
wherein the first transistor further comprises a lower impurity region connected to a lower end portion of the first channel region and an upper impurity region connected to an upper end portion of the first channel region, and
wherein the third conductive line is connected to the lower impurity region of the first transistor.

16. The semiconductor memory device of claim 11, further comprising a ferroelectric capacitor between the first transistor and the capacitor,
wherein the ferroelectric capacitor comprises:
a third electrode disposed above the first transistor, the third electrode having a cylindrical shape to define a pillar-type space;
a ferroelectric film disposed on an inner surface of the third electrode in the pillar-type space; and
a fourth electrode disposed on an inner surface of the ferroelectric film in the pillar-type space, and surrounded by the third electrode.

17. The semiconductor memory device of claim 16, wherein each of the first electrode, the second electrode, and the dielectric film of the capacitor is outside the pillar-type space.

18. The semiconductor memory device of claim 16, wherein the first electrode of the capacitor comprises a first local portion passing through the inner space defined by the first channel region and a second local portion inserted into the pillar-type space defined by the third electrode.

19. A semiconductor memory device comprising:
a plurality of first transistors repeatedly arranged in a first lateral direction and a second lateral direction at a first vertical level above a substrate, the plurality of first transistors comprising a plurality of first channel regions, each of the plurality of first channel regions providing a channel in a vertical direction, wherein the first lateral direction intersects with the second lateral direction;
a plurality of second transistors repeatedly arranged in the first lateral direction and the second lateral direction at a second vertical level above the substrate, the plurality of second transistors comprising a plurality of second channel regions, each of the plurality of second channel regions defining inner spaces, wherein the second vertical level is higher than the first vertical level;
a plurality of capacitors passing through the plurality of second transistors in the vertical direction in the inner spaces respectively defined by the plurality of second channel regions, respectively; and
an upper conductive line connected to a first group of capacitors arranged in a line extending in the first lateral direction, from among the plurality of capacitors, the upper conductive line extending in the first lateral direction over the first group of capacitors to overlap the first group of capacitors in the vertical direction,
wherein the upper conductive line is configured to operate as a first common gate for a first group of second transistors in the second vertical level arranged in the line extending in the first lateral direction, from among the plurality of second transistors.

20. The semiconductor memory device of claim 19, wherein the plurality of first transistors further comprise a lower conductive line extending in the first lateral direction to face a sidewall of each of a first group of first channel regions arranged in the line extending in the first lateral direction, from among the plurality of first channel regions, and
wherein the lower conductive line is configured to operate as a second common gate of a first group of first transistors in the first vertical level arranged in the line extending in the first lateral direction, from among the plurality of first transistors.

* * * * *